United States Patent
Qing et al.

(10) Patent No.: US 12,361,891 B2
(45) Date of Patent: Jul. 15, 2025

(54) DISPLAY SUBSTRATE, MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Haigang Qing, Beijing (CN); Yunsheng Xiao, Beijing (CN); Miao Wang, Beijing (CN); Quanyong Gu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/269,762

(22) PCT Filed: Dec. 22, 2021

(86) PCT No.: PCT/CN2021/140564
§ 371 (c)(1),
(2) Date: Jun. 27, 2023

(87) PCT Pub. No.: WO2023/115401
PCT Pub. Date: Jun. 29, 2023

(65) Prior Publication Data
US 2024/0395214 A1 Nov. 28, 2024

(51) Int. Cl.
*G09G 3/3266* (2016.01)
*G09G 3/20* (2006.01)
(Continued)

(52) U.S. Cl.
CPC ........... *G09G 3/3266* (2013.01); *G11C 19/28* (2013.01); *G09G 3/20* (2013.01); *G09G 3/32* (2013.01);
(Continued)

(58) Field of Classification Search
CPC ......... G09G 3/3266; G09G 2310/0286; G09G 2310/08; G09G 2330/021;
(Continued)

(56) References Cited

U.S. PATENT DOCUMENTS 11,551,604 B2 * 1/2023 Kim ...................... G09G 3/3677
11,568,781 B2 * 1/2023 Lai .......................... G11C 19/28
(Continued)

FOREIGN PATENT DOCUMENTS

CN 108447439 A 8/2018
CN 209265989 U 8/2019
(Continued)

OTHER PUBLICATIONS

International Search Report for PCT/CN2021/140564 Mailed Sep. 21, 2022.

*Primary Examiner* — Douglas Wilson
(74) *Attorney, Agent, or Firm* — Ling Wu Stephen Yang Ling and Yang Intellectual Property

(57) ABSTRACT

A display substrate is disclosed, including a display area and a non-display area. The non-display area has a gate drive circuit including multiple cascaded shift register units. A shift register unit includes an input control circuit and an output circuit. The input control circuit is electrically connected to a clock signal line group, a first power supply line, a second power supply line and an output circuit, the output circuit is electrically connected to the first power supply line and a second power supply line. The input control circuit at least includes an input circuit and a first control circuit. The
(Continued)

clock signal line group, the second power supply line, the input control circuit, the output circuit and the first power supply line are arranged sequentially along a first direction. The input circuit is located between the second power supply line and the first control circuit in the first direction.

18 Claims, 9 Drawing Sheets

(51) Int. Cl.
  *G09G 3/36* (2006.01)
  *G11C 19/28* (2006.01)
  *H10K 59/12* (2023.01)
  *H10K 71/20* (2023.01)
  *G09G 3/32* (2016.01)

(52) U.S. Cl.
  CPC ... *G09G 3/3674* (2013.01); *G09G 2300/0408* (2013.01); *G09G 2300/0426* (2013.01); *G09G 2310/0243* (2013.01); *G09G 2310/0267* (2013.01); *G09G 2310/0286* (2013.01); *G09G 2310/0289* (2013.01); *G09G 2310/08* (2013.01); *G09G 2330/021* (2013.01); *G11C 19/287* (2013.01); *H10K 59/1201* (2023.02); *H10K 71/20* (2023.02)

(58) Field of Classification Search
  CPC ......... G09G 2300/0408; G09G 3/3674; G09G 2310/0243; G09G 2310/0289; G09G 3/20; G09G 3/32; G09G 2300/0426; G09G 2310/0267; G11C 19/28; G11C 19/287; G11C 27/04; H10K 59/1201; H10K 71/20
  See application file for complete search history.

(56) References Cited

U.S. PATENT DOCUMENTS

| | | |
|---|---|---|
| 2008/0226013 A1 | 9/2008 | Deane |
| 2018/0136500 A1 | 5/2018 | Li |
| 2019/0371251 A1 | 12/2019 | Fan et al. |
| 2021/0193025 A1 | 6/2021 | Xu et al. |
| 2021/0366353 A1* | 11/2021 | Weng ................ G09G 3/2092 |
| 2021/0366354 A1 | 11/2021 | Li et al. |
| 2022/0068212 A1 | 3/2022 | Yao et al. |
| 2023/0215396 A1* | 7/2023 | Koyama ................ G11C 19/00 345/55 |

FOREIGN PATENT DOCUMENTS

| | | |
|---|---|---|
| CN | 110992873 A | 4/2020 |
| CN | 111402828 A | 7/2020 |
| CN | 210956110 U | 7/2020 |
| CN | 111816691 A | 10/2020 |
| CN | 113471225 A | 10/2021 |
| CN | 214588040 U | 11/2021 |

* cited by examiner

DISPLAY SUBSTRATE, MANUFACTURING METHOD THEREFOR, AND DISPLAY APPARATUS

CROSS-REFERENCE TO RELATED APPLICATION

The present application is a U.S. National Phase Entry of International Application PCT/CN2021/140564 having an international filing date of Dec. 22, 2021, and entitled "Display Substrate, Manufacturing Method Therefor, and Display Apparatus", the contents of the above-identified application are incorporated herein by reference.

TECHNICAL FIELD

The present disclosure relates to, but is not limited to, the field of display technologies, and particularly to a display substrate, a method for manufacturing the display substrate, and a display apparatus.

BACKGROUND

An Organic Light Emitting Diode (OLED) and a Quantum dot Light Emitting Diode (QLED) are active light emitting display devices and have advantages of self-luminescence, wide viewing angle, high contrast ratio, low power consumption, very high response speed, lightness and thinness, bendability, and low cost, etc. With the continuous development of display technology, a display apparatus using an OLED or QLED as a light emitting device and a Thin Film Transistor (TFT) for signal control has become a mainstream product in the field of display at present.

SUMMARY

The following is a summary of subject matter described herein in detail. The summary is not intended to limit the protection scope of claims.

Embodiments of the present disclosure provide a display substrate, a method for manufacturing the display substrate, and a display apparatus.

In one aspect, an embodiment of the present disclosure provides a display substrate, including a display area and a non-display area, wherein the non-display area is provided with a gate drive circuit, the gate drive circuit includes a plurality of cascaded shift register units, and a shift register unit of the plurality of cascaded shift register units includes an input control circuit and an output circuit. The input control circuit is electrically connected to a clock signal line group, a first power supply line, a second power supply line, and the output circuit, and the output circuit is electrically connected to the first power supply line and the second power supply line. The input control circuit at least includes an input circuit and a first control circuit, wherein the input circuit is at least electrically connected to a first node and a second node, and the first control circuit is at least electrically connected to the first node, the second node and a first output control node, and is configured to control a voltage of the first output control node under the control of the first node and the second node; and the output circuit is electrically connected to the first output control node. The clock signal line group, the second power supply line, the input control circuit, the output circuit and the first power supply line are sequentially arranged along a first direction. The input circuit is located between the second power supply line and the first control circuit in the first direction.

In some exemplary implementations, the input control circuit further includes a second control circuit. The second control circuit is at least electrically connected to the first node and a second output control node, and is configured to control a voltage of the second output control node under control of the first node. The output circuit is electrically connected to the second output control node. The second control circuit is located between the first control circuit and the output circuit in the first direction, and is adjacent to the first control circuit in the second direction, wherein the first direction intersects with the second direction.

In some exemplary implementations, the input circuit includes a first input sub-circuit and a second input sub-circuit. The first input sub-circuit is electrically connected to an input terminal, a first clock signal line and the first node, and the second input sub-circuit is electrically connected to the first clock signal line and the second node. The second input sub-circuit is located between the second power supply line and the first input sub-circuit in the first direction.

In some exemplary implementations, the first input sub-circuit includes a first transistor, and the second input sub-circuit includes a third transistor. An active layer of the first transistor extends along the first direction, and an active layer of the third transistor extends along the second direction.

In some exemplary implementations, the first control circuit at least includes a first control sub-circuit. The first control sub-circuit is electrically connected to an input terminal, a second clock signal line, the second node and the first power supply line, and is configured to transmit a first voltage signal provided by the first power supply line to the second node under control of the input terminal and the second clock signal line. The first control sub-circuit is adjacent to the input circuit in the first direction, and is located on a side of the input circuit away from the second power supply line; and the first control sub-circuit is arranged along the first direction.

In some exemplary implementations, the first control sub-circuit includes a second transistor and a fifth transistor. Active layers of the second transistor and the fifth transistor both extend along the first direction.

In some exemplary implementations, the first control circuit further includes a second control sub-circuit. The second control circuit is electrically connected to the second clock signal line, the second node, and the first output control node, is configured to control a voltage of the first output control node under control of the second node and the second clock signal line. The second control sub-circuit is located between the second power supply line and the second control circuit in the first direction, and is located on a same side of the input circuit and the first control sub-circuit in the second direction.

In some exemplary implementations, the second control sub-circuit at least includes a sixth transistor, a seventh transistor and a first capacitor. The first capacitor is located on a side of the sixth transistor close to the second power supply line in the first direction, and the seventh transistor is located on a side of the sixth transistor away from the second power supply line in the first direction. An active layer of the sixth transistor extends along the second direction, and an active layer of the seventh transistor extends along the first direction.

In some exemplary implementations, the second control sub-circuit further includes a twelfth transistor, wherein the twelfth transistor is located on a side of the first capacitor close to the second power supply line in the first direction and is adjacent to the input circuit in the second direction. An active layer of the twelfth transistor extends along the second direction.

In some exemplary implementations, the first control circuit further includes a third control sub-circuit. The third control sub-circuit is electrically connected to the first power supply line, the first node and the first output control node, and is configured to transmit the first voltage signal provided by the first power supply line to the first output control node under control of the first node, or to provide the first voltage signal to the first node under control of the first output control node. The third control sub-circuit is located between the first control sub-circuit and the output circuit in the first direction, and is adjacent to the second control circuit in the second direction.

In some exemplary implementations, the third control sub-circuit includes a fourth transistor, an eighth transistor and a third capacitor. The fourth transistor is located between the eighth transistor and the third capacitor in the first direction, wherein the third capacitor is adjacent to the output circuit in the first direction, and the eighth transistor is adjacent to the first control sub-circuit in the first direction. Active layers of the fourth transistor and the eighth transistor both extend along the second direction.

In some exemplary implementations, control electrodes of the fourth transistor and the eighth transistor both extend along the first direction, and the control electrode of the fourth transistor and one of the plates of the third capacitor are of an integral structure.

In some exemplary implementations, the third control sub-circuit and the first control sub-circuit are electrically connected to the first power supply line through a first power supply connection electrode. An orthographic projection of the first power supply connection electrode on a base substrate is overlapped with an orthographic projection of the third capacitor on the base substrate.

In some exemplary implementations, the second control circuit at least includes a thirteenth transistor and a second capacitor, wherein the thirteenth transistor and the second capacitor are adjacent in the second direction, and the second capacitor is located on a side of the thirteenth transistor away from the first control circuit.

In some exemplary implementations, an active layer of the thirteenth transistor extends along the first direction, and a control electrode of the thirteenth transistor and one of the plates of the second capacitor are of an integral structure.

In some exemplary implementations, the second control circuit further includes an eleventh transistor, wherein the eleventh transistor is located between the thirteenth transistor and the output circuit in the first direction and located between the first control circuit and the second capacitor in the second direction, and an active layer of the eleventh transistor extends along the first direction.

In some exemplary implementations, the second power supply line is electrically connected to the output circuit through a second power supply connection electrode, wherein the second power supply connection line extends along the first direction, and an orthographic projection on the base substrate is overlapped with an orthographic projection of the second capacitor on the base substrate.

In some exemplary implementations, a first voltage signal output by the first power supply line is greater than a second voltage signal output by the second power supply line.

In another aspect, an embodiment of the present disclosure provides a display apparatus, which includes the aforementioned display substrate.

In another aspect, an embodiment of the present disclosure provides a method for manufacturing a display substrate, which is used for manufacturing the above-mentioned display substrate. The method includes: providing a base substrate and forming a gate drive circuit in a non-display area. The gate drive circuit includes a plurality of cascaded shift register units, wherein a shift register unit of the plurality of cascaded shift register units includes an input control circuit and an output circuit. The input control circuit is electrically connected to a clock signal line group, a first power supply line, a second power supply line, and the output circuit, and the output circuit is electrically connected to the first power supply line and the second power supply line. The input control circuit at least includes an input circuit and a first control circuit, wherein the input circuit is at least electrically connected to a first node and a second node, and the first control circuit is at least electrically connected to the first node, the second node and a first output control node, and is configured to control a voltage of the first output control node under control of the first node and the second node; and the output circuit is electrically connected to the first output control node. The clock signal line group, the second power supply line, the input control circuit, the output circuit and the first power supply line are arranged sequentially along a first direction. The input circuit is located between the second power supply line and the first control circuit in the first direction.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
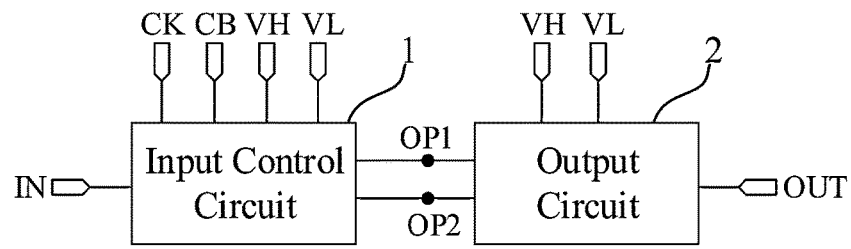
FIG. 1 is a schematic diagram of a structure of a shift register unit according to at least one embodiment of the present disclosure.

The embodiments of the present disclosure will be described below with reference to the drawings in detail. Implementations may be implemented in a plurality of different forms. Those of ordinary skills in the art may easily understand such a fact that implementations and contents may be transformed into one or more forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one implementation of the present disclosure is not necessarily limited to the size, and a shape and a size of one or more components in the drawings do not reflect an actual scale. In addition, the drawings schematically illustrate ideal examples, and one implementation of the present disclosure is not limited to shapes, numerical values, or the like shown in the drawings.

Ordinal numerals such as "first", "second" and "third" in the present disclosure are set to avoid confusion between constituent elements, but not intended for restriction in quantity. In the present disclosure, "a plurality/multiple" represents two or more than two.

In the present disclosure, for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings, which are only used to facilitate describing the present specification and simplify the description, rather than indicating or implying that involved apparatuses or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations. Among them, an "electrical connection" includes a case where constituent elements are connected together through an element with a certain electrical effect. The "element with the certain electrical effect" is not particularly limited as long as electrical signals between the connected constituent elements may be transmitted. Examples of the "element with the certain electrical effect" not only include electrodes and wirings, but also include switching elements such as transistors, resistors, inductors, capacitors, other elements with one or more functions, etc.

In the present disclosure, a transistor refers to an element at least including three terminals, i.e., a gate electrode (gate), a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the present disclosure, the channel region refers to a region through which a current mainly flows.

In the present disclosure, for distinguishing the two electrodes except the gate electrode, of the transistor, one electrode is called a first electrode, and the other electrode is called a second electrode. The first electrode may be a source electrode or a drain electrode, and the second electrode may be the drain electrode or the source electrode. In addition, the gate electrode of the transistor is called a control electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "parallel" refers to a state in which an angle formed by two straight lines is above $-10°$ and below $10°$, and thus may include a state in which the angle is above $-5°$ and below $5°$. In addition, "perpendicular" refers to a state in which an angle formed by two straight lines is above $80°$ and below $100°$, and thus may include a state in which the angle is above $85°$ and below $95°$.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about" and "substantially" refer to that a boundary is not defined strictly and a case within a range of a process and measurement error is allowed.

An embodiment of the present disclosure provides a display substrate, including a display area and a non-display area. The non-display area is provided with a gate drive circuit. The gate drive circuit includes a plurality of cascaded shift register units. Each shift register unit includes an input control circuit and an output circuit. The input control circuit is electrically connected to a clock signal line group, a first power supply line, a second power supply line and the output circuit. The output circuit is electrically connected to the first power supply line and the second power supply line. The input control circuit at least includes an input circuit and a first control circuit. The input circuit is at least electrically connected to the first node and the second node. The first control circuit is at least electrically connected to the first node, the second node, and a first output control node, and is configured to control a voltage of the first output control node under control of the first node and the second node. The output circuit is electrically connected to the first output control node. The clock signal line group, the second power supply line, the input control circuit, the output circuit and the first power supply line are sequentially arranged along a first direction. The input circuit is located between the second power supply line and the first control circuit in the first direction.

In some exemplary implementations, a first voltage signal provided by the first power supply line is greater than a second voltage signal provided by the second power supply line. For example, the first voltage signal is a high-level signal and the second voltage signal is a low-level signal. However, this embodiment is not limited thereto.

In the display substrate provided by the embodiment, the clock signal line group, the second power supply line, the input control circuit, the output circuit and the first power supply line are sequentially arranged along the first direction, and the input circuit is located between the second power supply line and the first control circuit in the first direction, so that space layout of the shift register unit may be optimized and space occupied by the shift register unit may be saved. For example, it is conducive to achieving a display substrate with a narrow bezel design.

In some exemplary implementations, the input control circuit further includes a second control circuit. The second control circuit is at least electrically connected to the first node and a second output control node, and is configured to control a voltage of the second output control node under control of the first node. The output circuit is electrically connected to the second output control node. The second control circuit is located between the first control circuit and the output circuit in the first direction, and is adjacent to the first control circuit in a second direction. The first direction intersects with the second direction. The arrangement mode of the input control circuit of this embodiment may optimize the space layout of the shift register unit, thereby saving the space occupied by the shift register unit.

In some exemplary implementations, the input circuit includes a first input sub-circuit and a second input sub-circuit. The first input sub-circuit is electrically connected to an input terminal, a first clock signal line and the first node, and the second input sub-circuit is electrically connected to the first clock signal line and the second node. The second input sub-circuit is located between the second power supply line and the first input sub-circuit in the first direction. In this example, the first input sub-circuit and the second input sub-circuit are arranged adjacent to each other, which may facilitate arrangement of transmission trace of a first clock signal.

In some exemplary implementations, the first input sub-circuit includes a first transistor, and the second input sub-circuit includes a third transistor. An active layer of the first transistor extends along the first direction, and an active layer of the third transistor extends along the second direction. In this example, the arrangement mode of the first transistor and the third transistor may facilitate the arrangement of the transmission trace of the first clock signal.

In some exemplary implementations, the first control circuit at least includes a first control sub-circuit. The first control sub-circuit is electrically connected to the input terminal, a second clock signal line, the second node and the first power supply line, and is configured to transmit a first voltage signal provided by the first power supply line to the second node the control of the input terminal and the second clock signal line. The first control sub-circuit is adjacent to the input circuit in the first direction, and is located on a side of the input circuit away from the second power supply line. The first control sub-circuit is arranged along the first direction. In this example, the arrangement mode of the first control sub-circuit may facilitate arrangement of transmission traces of an input signal and a second clock signal.

In some exemplary implementations, the first control sub-circuit includes a second transistor and a fifth transistor. Active layers of the second transistor and the fifth transistor both extend along the first direction. In this example, the second transistor and the fifth transistor are arranged in close proximity, which may reduce the space occupation caused by placing the second transistor and the fifth transistor separately.

In some exemplary implementations, the first control circuit further includes a second control sub-circuit. The second control circuit is electrically connected to the second clock signal line, the second node, and the first output control node, and is configured to control the voltage of the first output control node under control of the second node and the second clock signal line. The second control sub-circuit is located between the second power supply line and the second control circuit in the first direction, and is located on a same side of the input circuit and the first control sub-circuit in the second direction. In this example, the arrangement mode of the second control sub-circuit may facilitate arrangement of transmission trace of the second clock signal.

In some exemplary implementations, the second control sub-circuit at least includes a sixth transistor, a seventh transistor and a first capacitor. The first capacitor is located on a side of the sixth transistor close to the second power supply line in the first direction, and the seventh transistor is located on a side of the sixth transistor away from the second power supply line in the first direction. An active layer of the sixth transistor extends along the second direction, and an active layer of the seventh transistor extends along the first direction. In this example, the arrangement mode of the first capacitor, the sixth transistor, and the seventh transistor may facilitate the arrangement of the transmission trace of the second clock signal, thereby saving occupied space.

In some exemplary implementations, the second control sub-circuit further includes a twelfth transistor. The twelfth transistor is located on a side of the first capacitor close to the second power supply line in the first direction, and is adjacent to the input circuit in the second direction. An active layer of the twelfth transistor extends along the second direction. In this example, the arrangement mode of the twelfth transistor may facilitate sharing of the trace arrangement of the second node.

In some exemplary implementations, the first control circuit further includes a third control sub-circuit. The third control sub-circuit is electrically connected to the first power supply line, the first node and the first output control node, and is configured to transmit a first voltage signal provided by the first power supply line to the first output control node under control of the first node, or to provide the first voltage signal to the first node under control of the first output control node. The third control sub-circuit is located between the first control sub-circuit and the output circuit in the first direction, and is adjacent to the second control circuit in the second direction. In this example, the arrangement mode of the third control sub-circuit may facilitate arrangement of transmission trace of the first voltage signal, thereby saving occupied space.

In some exemplary implementations, the third control sub-circuit includes a fourth transistor, an eighth transistor and a third capacitor. The fourth transistor is located between the eighth transistor and the third capacitor in the first direction. The third capacitor is adjacent to the output circuit in the first direction, and the eighth transistor is adjacent to the first control sub-circuit in the first direction. Active layers of the fourth transistor and the eighth transistor both extend along the second direction. In this example, the arrangement mode of the fourth transistor, the eighth transistor, and the third capacitor is conducive to saving the occupied space.

In some exemplary implementations, control electrodes of the fourth transistor and the eighth transistor both extend along the first direction, and the control electrode of the fourth transistor and one of plates of the third capacitor are of an integral structure. In this example, the fourth transistor and the third capacitor are placed adjacent to each other, so that the one of the plates of the third capacitor may be shared as the control electrode of the fourth transistor, thereby saving occupied space.

In some exemplary implementations, the third control sub-circuit and the first control sub-circuit are electrically connected to the first power supply line through a first power supply connection electrode. An orthographic projection of the first power supply connection electrode on the base substrate is overlapped with an orthographic projection of the third capacitor on the base substrate. The arrangement mode of the first power supply connection electrode in this example may save occupied space.

In some exemplary implementations, the second control circuit at least includes a thirteenth transistor and a second capacitor. The thirteenth transistor and the second capacitor are adjacent to each other in the second direction, and the second capacitor is located on a side of the thirteenth transistor away from the first control circuit.

In some exemplary implementations, an active layer of the thirteenth transistor extends along the first direction, and a control electrode of the thirteenth transistor and one of plates of the second capacitor are of an integral structure. In this example, the thirteenth transistor is arranged adjacent to the second capacitor in close proximity, so that the one of the plates of the second capacitor may be shared as a control electrode of the thirteenth transistor, thereby saving occupied space.

In some exemplary implementations, the second control circuit further includes an eleventh transistor. The eleventh transistor is located between the thirteenth transistor and the output circuit in the first direction, and is located between the first control circuit and the second capacitor in the second direction. An active layer of the eleventh transistor extends along the first direction.

In some exemplary implementations, the second power supply line is electrically connected to the output circuit through a second power supply connection electrode. The second power supply connection line extends along the first direction, and an orthographic projection of the second power supply connection line on the base substrate is overlapped with an orthographic projection of the second capacitor on the base substrate. The arrangement mode of the second power supply connection electrode in this example may save occupied space.

Solutions of the embodiments will be described below through some examples.

In some exemplary implementations, the display substrate may include: a display area and a non-display area. For example, the non-display area may be located at a periphery of the display area. However, this embodiment is not limited thereto. For example, the non-display area may be located between adjacent display areas.

In some exemplary implementations, the display area at least includes a plurality of regularly arranged pixel circuits, a plurality of gate lines (for example, including a scanning line, a reset signal line, and a light emitting control line) extending along the first direction, a plurality of data lines extending along the second direction, and a power supply line. The first direction and the second direction are located in a same plane, and the first direction interacts with the second direction, for example, the first direction is perpendicular to the second direction.

In some exemplary implementations, one pixel unit in the display area may include three sub-pixels, and the three sub-pixels may be a red sub-pixel, a green sub-pixel, and a blue sub-pixel respectively. However, this embodiment is not limited thereto. In some examples, one pixel unit may include four sub-pixels, and the four sub-pixels are a red sub-pixel, a green sub-pixel, a blue sub-pixel, and a white sub-pixel respectively.

In some exemplary implementations, a shape of a sub-pixel may be a rectangle, a rhombus, a pentagon, or a hexagon. When one pixel unit includes three sub-pixels, the three sub-pixels may be arranged side by side horizontally, side by side vertically, or in a triangle arrangement. When one pixel unit includes four sub-pixels, the four sub-pixels may be arranged side by side horizontally, side by side vertically, or in a square arrangement. However, this embodiment is not limited thereto.

In some exemplary implementations, a timing controller, a data drive circuit, and a gate drive circuit may be arranged in the non-display area. The gate drive circuit may be arranged on two opposite sides of the display area respectively, such as left and right sides of the display area. The timing controller and the data drive circuit may be arranged on a side of the display area, such as a lower side of the display area. However, this embodiment is not limited thereto.

In some exemplary implementations, the data drive circuit may provide a data signal to a sub-pixel through a data line. The gate drive circuit may provide a scanning signal to a sub-pixel through a scanning line, and provide a reset signal to a sub-pixel through a reset signal line, or provide a light emitting control signal to a sub-pixel through a light emitting control line. The timing controller may provide a drive signal to the data drive circuit and the gate drive circuit. Actions of the gate drive circuit and the data drive circuit may be controlled by the timing controller. The timing controller may provide the data drive circuit with gray scale data specifying a gray scale that should be displayed at a sub-pixel. The data drive circuit may provide, via a data line, a data signal of a potential corresponding to the gray scale data of the sub-pixel to sub-pixels of a row selected by the gate drive circuit.

In some exemplary implementations, the pixel drive circuit may have a structure of 3T1C, 4T1C, 5T1C, 5T2C, 6T1C, 7T1C, 8T1C or 8T2C. However, this embodiment is not limited thereto. For example, the pixel drive circuit may include an N-type transistor and a P-type transistor. The N-type transistor may be, for example, an oxide thin film transistor and the P-type transistor may be, for example, a Low Temperature Poly-Silicon thin film transistor. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as a high mobility rate and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized, which may achieve low-frequency drive, reduce power consumption, and improve display quality.

In some exemplary implementations, the gate drive circuit may include a plurality of cascaded shift register units. For example, an input terminal of a first stage shift register unit may be connected to a start signal line, and an output terminal of an i-th stage shift register unit may be connected to an input terminal of an (i+1)-th stage shift register unit to provide an input signal to the (i+1)-th stage shift register unit, wherein i is a positive integer. For example, the output of the shift register unit may provide a light emitting control signal to a sub-pixel through a light emitting control line. However, this embodiment is not limited thereto.

FIG. 1 is a schematic diagram of a structure of a shift register unit according to at least one embodiment of the present disclosure. In some exemplary implementations, as shown in FIG. 1, the shift register unit provided by this embodiment may include an input control circuit 1 and an output circuit 2. The input control circuit 1 is electrically connected to an input terminal IN, a first clock terminal CK, a second clock terminal CB, a first power supply terminal VH, a second power supply terminal VL, a first output control node OP1 and a second output control node OP2. The input control circuit 1 is configured to control voltages of the first output control node OP1 and the second output control node OP2 under control of the input terminal IN, the first clock terminal CK, and the second clock terminal CB. The output circuit 2 is electrically connected to the first power supply terminal VH, the second power supply terminal VL, the output terminal OUT, the first output control node OP1 and the second output control node OP2. The output circuit 2 is configured to output a first voltage signal provided by the first power supply terminal VH under control of the first output control node OP1 or a second voltage signal provided by the second power supply terminal VL under control of the second output control node OP2.

In some exemplary implementations, the first power supply terminal VH may continuously provide a first voltage signal with a high level, and the second power supply terminal VL may continuously provide a second voltage signal with a low level. The first voltage signal provided by the first power supply terminal VH is larger than the second voltage signal provided by the second power supply terminal VL. However, this embodiment is not limited thereto. The "high level" and "low level" mentioned herein are relative, and voltage values of "high level" and "low level" are not limited.

Figure 2:
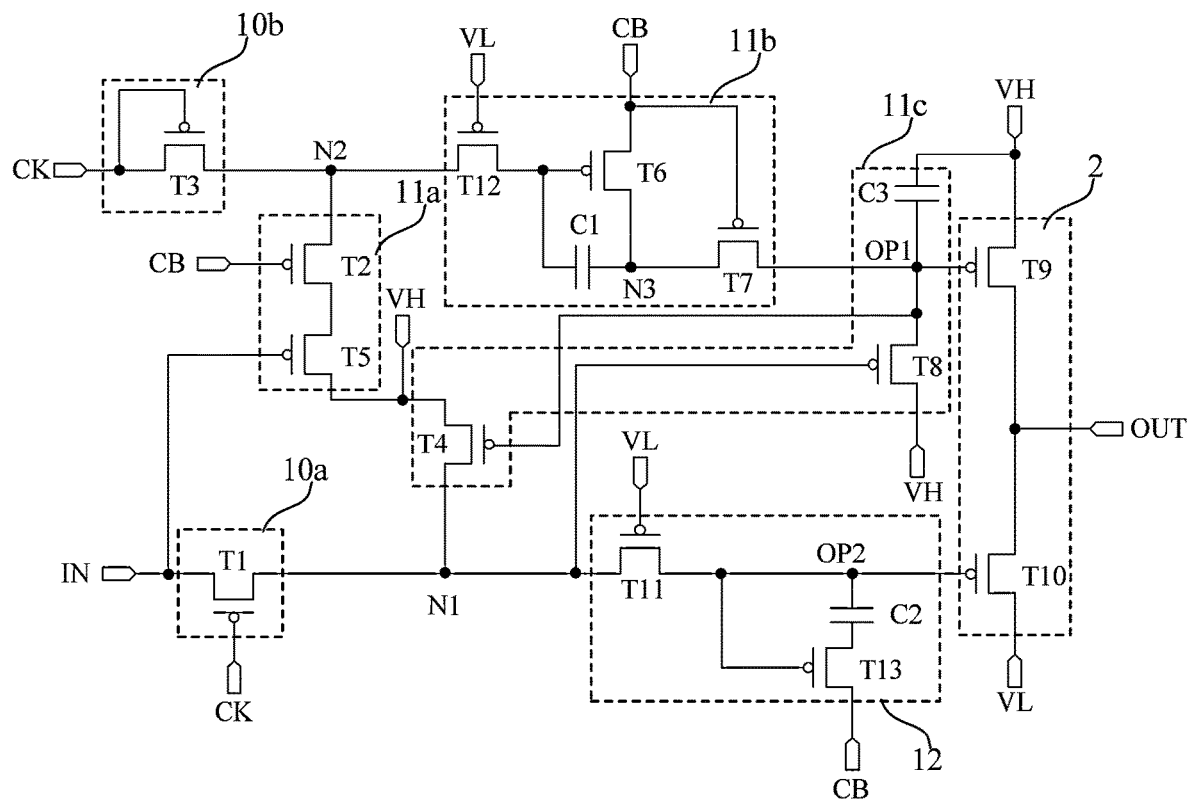
FIG. 2 is an equivalent circuit diagram of a shift register unit according to at least one embodiment of the present disclosure.

FIG. 2 is an equivalent circuit diagram of a shift register unit according to at least one embodiment of the present disclosure. As shown in FIG. 2, an input control circuit 1 includes an input circuit, a first control circuit, and a second control circuit. The input circuit is at least electrically connected to a first node N1 and a second node N2. The first control circuit is at least electrically connected to the first node N1, the second node N2, and a first output control node OP1, and is configured to control a voltage of the first output control node OP1 under control of the first node N1 and the second node N2. The second control circuit is at least electrically connected to the first node N1 and the second output control node OP2, and is configured to control a voltage of the second output control node OP2 under control of the first node N1.

In some exemplary implementations, as shown in FIG. 2, the input circuit includes a first input sub-circuit 10a and a second input sub-circuit 10b. The first input sub-circuit 10a is electrically connected to an input terminal IN, a first clock terminal CK, and a first node N1, and is configured to transmit an input signal provided by the input terminal IN to the first node N1 under control of the first clock terminal CK. The second input sub-circuit 10b is electrically connected to the first clock terminal CK and the second node N2, and is configured to transmit a first clock signal provided by the first clock terminal CK to the second node N2 under control of the first clock terminal CK.

In some exemplary implementations, as shown in FIG. 2, the first control circuit includes a first control sub-circuit 11a, a second control sub-circuit 11b, and a third control sub-circuit 11c. The first control sub-circuit 11a is electrically connected to the input terminal IN, a second clock terminal CB, the second node N2 and a first power supply terminal VH, and is configured to transmit a first voltage signal provided by the first power supply terminal VH to the second node N2 under control of the input terminal IN and the second clock terminal CB. The second control sub-circuit 11b is electrically connected to the second node N2, the first output control node OP1, the second clock terminal CB, and a second power supply terminal VL, and is configured to control a voltage of first output control node OP1 under control of the second node N2 and the second clock terminal CB. The third control sub-circuit 11c is electrically connected to the first power supply terminal VH, the first node N1, and the first output control node OP1, and is configured to transmit the first voltage signal provided by the first power supply terminal VH to the first output control node OP1 under control of the first node N1, or to provide the first voltage signal to the first node N1 under control of the first output control node OP1. The second control circuit 12 is electrically connected to the first node N1, the second output control node OP2, and the second clock terminal CB, and is configured to control a voltage of the second output control node OP2 under control of the first node N1.

In some exemplary implementations, as shown in FIG. 2, the first input sub-circuit 10a includes a transistor T1. The second input sub-circuit 10b includes a third transistor T3. A control electrode of the first transistor T1 is electrically connected to the first clock terminal CK, a first electrode of the first transistor T1 is electrically connected to the input terminal IN, and a second electrode of the first transistor T1 is electrically connected to the first node N1. A control electrode and a first electrode of the third transistor T3 are electrically connected to the first clock terminal CK, and a second electrode of the third transistor T3 is electrically connected to the second node N2.

In some exemplary implementations, as shown in FIG. 2, the first control sub-circuit 11a includes a second transistor T2 and a fifth transistor T5. A control electrode of the second transistor T2 is electrically connected to the second clock terminal CB, a second electrode of the second transistor T2 is electrically connected to the first node N2, and a first electrode of the second transistor T2 is electrically connected to a second electrode of the fifth transistor T5. A control electrode of the fifth transistor T5 is electrically connected to the input terminal IN, and a first electrode of the fifth transistor T5 is electrically connected to the first power supply terminal VH.

As shown in FIG. 2, the second control sub-circuit 11b includes a sixth transistor T6, a seventh transistor T7, a twelfth transistor T12 and a first capacitor C1. A control electrode of the twelfth transistor T12 is electrically connected to the second power supply terminal VL, a first electrode of the twelfth transistor T12 is electrically connected to the second node N2, and a second electrode of the twelfth transistor T12 is electrically connected to a control electrode of the sixth transistor T6. A first electrode of the sixth transistor T6 is electrically connected to the second clock terminal CB, and a second electrode of the sixth transistor T6 is electrically connected to the third node N3. A control electrode of the seventh transistor T7 is electrically connected to the second clock terminal CB, a first electrode of the seventh transistor T7 is electrically connected to the third node N3, and a second electrode of the seventh transistor T7 is electrically connected to the first output control node OP1. A first plate of the first capacitor C1 is electrically connected to the control electrode of the sixth transistor T6, and a second plate of the first capacitor C1 is electrically connected to the third node N3.

As shown in FIG. 2, the third control sub-circuit 11c includes a fourth transistor T4, an eighth transistor T8 and a third capacitor C3. A control electrode of the fourth transistor T4 is electrically connected to the first output control node OP1, a first electrode of the fourth transistor T4 is electrically connected to the first power supply terminal VH, and a second electrode of the fourth transistor T4 is electrically connected to the first node N1. A control electrode of the eighth transistor T8 is electrically connected to the first node N1, a first electrode of the eighth transistor T8 is electrically connected to the first power supply terminal VH, and a second electrode of the eighth transistor T8 is connected to the first output control node OP1. A first plate of the third capacitor C3 is electrically connected to the first output control node OP1, and a second plate of the third capacitor C3 is electrically connected to the second power supply terminal VH.

As shown in FIG. 2, the second control circuit 12 includes an eleventh transistor T11, a thirteenth transistor T13 and a second capacitor C2. A control electrode of the eleventh transistor T11 is electrically connected to the second power supply terminal VL, a first electrode of the eleventh transistor T11 is electrically connected to the first node N1, and a second electrode of the eleventh transistor T11 is electrically connected to the second output control node OP2. A control electrode of the thirteenth transistor T13 is electrically connected to the second output control node OP2, a first electrode of the thirteenth transistor T13 is electrically connected to the second clock terminal CB, and a second electrode of the thirteenth transistor T13 is electrically connected to a second plate of a second capacitor C2. A first plate of the second capacitor C2 is electrically connected to the second output control node OP2.

As shown in FIG. 2, the output circuit 2 includes a ninth transistor T9 and a tenth transistor T10. A control electrode of the ninth transistor T9 is electrically connected to the first output control node OP1, a first electrode of the ninth transistor T9 is electrically connected to the first power supply terminal VH, and a second electrode of the ninth transistor T9 is electrically connected to the output terminal OUT. A control electrode of the tenth transistor T10 is electrically connected to the second output control node OP2, a first electrode of the tenth transistor T10 is electrically connected to the second power supply terminal VL, and a second electrode of the tenth transistor T10 is electrically connected to the output terminal OUT.

In this exemplary implementation, the first node N1 is a connection point for the first transistor T1, the fourth transistor T4, the eighth transistor T8 and the eleventh transistor T11. The second node N2 is a connection point for the third transistor T3, the second transistor T2, and the twelfth transistor T12. The third node N3 is a connection point for the sixth transistor T6, the seventh transistor T7 and the first capacitor C1. The first output control node OP1 is a connection point for the seventh transistor T7, the eighth transistor T8, the fourth transistor T4, the ninth transistor T9 and the third capacitor C3. The second output control node OP2 is a connection point for the eleventh transistor T11, the thirteenth transistor T13, the tenth transistor T10 and the second capacitor C2.

In this exemplary implementation, the first node N1, the second node N2, the third node N3, the first output control node OP1 and the second output control node OP2 do not represent components that actually exist, but represent junctions of related electrical connections in the circuit diagram. In other words, these nodes are nodes equivalent to convergence points of related electrical connections in the circuit diagram.

In this exemplary implementation, an exemplary structure of the input circuit, the first control circuit, the second control circuit and the output circuit is shown in FIG. 2. It is easy for those skilled in the art to understand that implementations of the input circuit, the first control circuit and the second control circuit are not limited thereto as long as a function thereof may be achieved.

Figure 3:
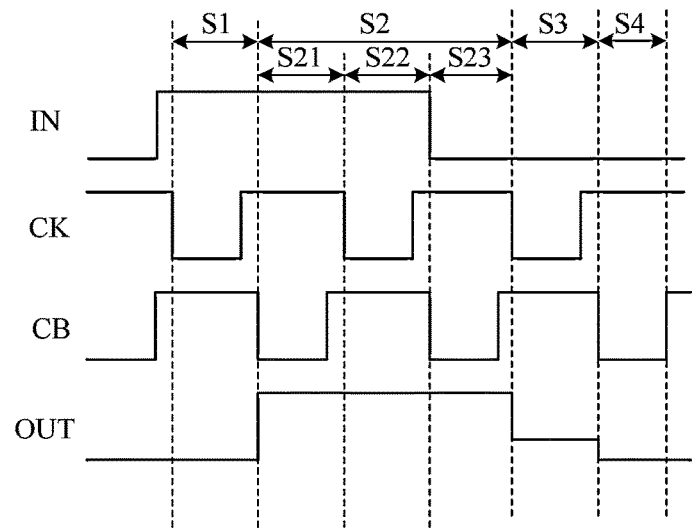
FIG. 3 is an operating timing diagram of the shift register unit shown in FIG. 2.

Technical solutions of the embodiments of the present disclosure will be further described below through an operating process of a shift register unit. The following description is made by taking an operating process of a first stage shift register unit as an example. An input terminal IN of the first stage shift register unit is connected to a start signal line STV. FIG. 3 is an operating timing diagram of the shift register unit shown in FIG. 2.

A case that transistors in the shift register unit are all P-type transistors, the first voltage signal provided by the first power supply terminal VH is at a high level, and the second voltage signal provided by the second power supply terminal VL is at a low level, is taken as an example for following description.

As shown in FIG. 3, a drive process of the shift register unit in a row of gate lines provided in the exemplary implementation at least includes following phases: an input phase S1, an output phase S2, a buffer phase S3, and a stabilization phase S4. The output stage S2 includes a first sub-stage S21, a second sub-stage S22, and a third sub-stage S23.

In the input stage S1, the first clock terminal CK provides a first clock signal with a low-level, the second clock terminal CB provides a second clock signal with a high-level, and the input terminal IN provides an input signal with a high-level.

The first transistor T1 is turned on under control of the first clock signal with the low level, so that the input signal with the high level is transmitted to the first node N1 via the first transistor T1, and the eleventh transistor T11 is kept in a turned on state under control of the second voltage signal, so that the input signal at the first node N1 may be transmitted to the second output control node OP2, thus the first node N1 and the second output control node OP2 are both at a high level. Under control of the high level of the first node N1, the eighth transistor T8 is turned off; and under control of the high level of the second output control node OP2, both the tenth transistor T10 and the thirteenth transistor T13 are turned off. Both the second transistor T2 and the seventh transistor T7 are turned off under control of the second clock signal with the high level.

Since the second transistor T2 is turned off, a voltage of the second node N2 is not affected by the first power supply terminal VH. At this time, the third transistor T3 is turned on under control of the first clock signal with the low level, and the first clock signal with the low level is transmitted to the second node N2 via the third transistor T3, so that the second node N2 is at the low level. The twelfth transistor T12 is kept in a turned-on state under control of the second voltage signal, and may transmit the voltage of the second node N2 to the control electrode of the sixth transistor T6, so that the control electrode of the sixth transistor T6 is also at a low level, and the sixth transistor T6 is turned on. The second clock signal with the high level is written to the third node N3 via the sixth transistor T6, so that the third node N3 is at the high level.

Since both the seventh transistor T7 and the eighth transistor T8 are turned off, the voltage of the first output control node OP1 remains unchanged in the state of the previous stage and is at the high level, and the ninth transistor T9 is turned off, so that the output terminal OUT remains unchanged in the state of the previous stage, and the output signal is still at the low level.

In the first sub-stage S21 of the output stage S2, the first clock terminal CK provides a first clock signal with a high level, the second clock terminal CB provides a second clock signal with a low level, and the input terminal IN provides an input signal with the high level.

The first transistor T1 is turned off under control of the first clock signal with the high level, and voltages of the first node N1 and the second output control node OP2 remain unchanged, i.e. the voltages of the first node N1 and the second output control node OP2 are still at the high level. At this time, the eighth transistor T8 is turned off under control of the high level of the first node N1, and the tenth transistors T10 and thirteenth transistors T13 are turned off under control of the high level of the second output control node OP2. The third transistor T3 is turned off under control of the first clock signal with the high level. Although the second transistor T2 is turned on under control of the second clock signal with the low level, since the fifth transistor T5 is turned off under control of the input signal with the high level, the voltage of the second node N2 remains unchanged, that is, the voltage of the second node N2 is still at the low level.

The twelfth transistor T12 is kept in a turned-on state under control of the second voltage signal, and may transmit the voltage of the second node N2 to the control electrode of the sixth transistor T6, so that the control electrode of the sixth transistor T6 is still at a low level, and the sixth transistor T6 is still turned on. The second clock signal with the low level is written to the third node N3 via the sixth transistor T6, so that the voltage of the third node N3 jumps from the high level to the low level. Due to a coupling effect of the first capacitor C1, when the voltage of the third node N3 jumps from the high level to the low level, the voltage of the control electrode of the sixth transistor T6 jumps as well, which makes the voltage of the control electrode of the sixth transistor T6 lower, and the sixth transistor T6 be better turned on, so that the second clock signal with the low level may be transmitted to the third node N3 without threshold loss.

The seventh transistor T7 is turned on under control of the second clock signal with the low level, and the voltage of the third node N3 is written to the first output control node OP1, so that the first output control node OP1 is at a low level, which thus makes the ninth transistor T9 and the fourth transistor T4 turned on. The first voltage signal is written into the output terminal OUT through the ninth transistor T9, which completes the high-level output. The first voltage signal is written to the first node N1 via the fourth transistor T4 to maintain the high level of the first node N1.

In the second sub-stage S22 of the output stage S2, the first clock terminal CK provides a first clock signal with a low level, the second clock terminal CB provides a second clock signal with a high level, and the input terminal IN provides an input signal with a high level.

The first transistor T1 is turned on under control of the first clock signal with the low level, and the first node N1 is maintained at a high level. The second transistor T2 is turned off under control of the second clock signal with the high level, and the fifth transistor T5 is turned off under control of the input signal with the high level. The third transistor T3 is turned on under control of the first clock signal with the low level, so that the second node N2 is maintained at a low level. The twelfth transistor T12 is kept turned on, so that the control electrode of the sixth transistor T6 is maintained at a low level. The seventh transistor T7 is turned off under control of the second clock signal with the high level. The eighth transistor T8 is turned off under control of the high level of the first node N1, so that the voltage of the first output control node OP1 remains unchanged at the low-level of the previous stage. The ninth transistor T9 and the fourth transistor T4 are turned on under control of first output control node OP1 at the low level, and the output terminal OUT outputs a high-level signal and maintains the high level of the first node N1.

In the third sub-stage S23 of the output stage S2, the first clock terminal CK provides a first clock signal with a high level, the second clock terminal CB provides a second clock signal with a low level, and the input terminal IN provides an input signal with a low level.

The first transistor T1 is turned off under control of the first clock signal with the high level, the eleventh transistor T11 is kept turned on under control of the second voltage signal, and the voltages of the first node N1 and the second output control node OP2 remain unchanged and is still at the high level. The third transistor T3 is turned off under control of the first clock signal with the high level, the second transistor T2 is turned on under control of the second clock signal with the low level, and the fifth transistor T5 is turned on under control of the input signal with the low level, and writes the first voltage signal into the second node N2, and the second node N2 is at a high level. The twelfth transistor T12 is kept turned on under control of the second voltage signal, so that the control electrode of the sixth transistor T6 is at a high level and the sixth transistor T6 is turned off. The voltage of the third node N3 is kept unchanged at the low-level of the previous stage, and the seventh transistor T7 is turned on under control of the second clock signal with the low level, so that the first output control node OP1 is at the low level. The ninth transistor T9 and the fourth transistor T4 are turned on under control of the first output control node OP1 at the low level. The first voltage signal is written to the output terminal OUT through the ninth transistor T9, and the output terminal OUT is keeps outputting a high-level, while the first node N1 is maintained at the high level.

In the buffer stage S3, the first clock terminal CK provides a first clock signal with a low level, the second clock terminal CB provides a second clock signal with a high level, and the input terminal IN provides an input signal with a low level.

The third transistor T3 is turned on under control of the first clock signal with the low level, and the first clock signal with the low level is transmitted to the second node N2 via the third transistor T3, so that the second node N2 is kept at a low level. In addition, since the twelfth transistor T12 is turned on, the voltage of the second node N2 is transmitted to the control electrode of the sixth transistor T6 via the twelfth transistor T12, so that the sixth transistor T6 is turned on, and the second clock signal with the high level is written to the third node N3. The seventh transistor T7 is turned off under control of the second clock signal with the high level. The first transistor T1 is turned on under control of the first clock signal with the low level, the input signal with the low level is transmitted to the first node N1 via the first transistor T1, so that the first node N1 is at a low level, the eighth transistor T8 is turned on under control of the voltage of the first node N1, the first voltage signal is transmitted to the first output control node OP1 via the eighth transistor T8, and the third capacitor C3 is charged so that the first output control node OP1 is at a high level, and both the ninth transistor T9 and the fourth transistor T4 are turned off.

Both the first transistor T1 and the eleventh transistor T11 are turned on, and the input signal with the low level is transmitted to the second output control node OP2 via the first transistor T1 and the eleventh transistor T11, so that both the first node N1 and the second output control node OP2 are at a low level. Under control of the input signal with the low level, the fifth transistor T5 is turned on. Under control of the low level of the second output control node OP2, the thirteenth transistor T13 and the tenth transistor T10 are turned on. The second voltage signal provided by the second power supply terminal VL is output from the output terminal OUT through the tenth transistor T10. Since the tenth transistor T10 transmits a low-level signal with a threshold loss, the second voltage signal cannot be completely output to the output terminal OUT.

In the stabilization stage S4, the first clock terminal CK provides a first clock signal with a high level, the second clock terminal CB provides a second clock signal with a low level, and the input terminal IN provides an input signal with a low level.

The first transistor T1 is turned off under control of the first clock signal with the high level, the eleventh transistor T11 is turned on, and the voltages of the first node N1 and the second output control node OP2 are maintained unchanged at the low level of the buffer stage S3. The fifth transistor T5 is turned on under control of the input signal with the low level, the eighth transistor T8 is turned on under control of the low level of the first node N1, and the tenth transistor T10 and the thirteenth transistor T13 are turned on under control of the low level of the second output control node OP2.

The second transistor T2 is turned on under control of the second clock signal with the low level, and the first voltage signal is transmitted to the second node N2 via the second transistor T2 and the fifth transistor T5, so that the second node N2 is at a high level, and the voltage of the second node N2 is transmitted to the control electrode of the sixth transistor T6 via the twelfth transistor T12, so that the sixth transistor T6 is turned off, and the seventh transistor T7 is turned on under control of the second clock signal with the low level. The first voltage signal is transmitted to the first output control node OP1 via the eighth transistor T8, and charges the third capacitor C3, so that the first output control node OP1 is kept at a high level, and the ninth transistor T9 and the fourth transistor T4 are both turned off under control of the high level of the first output control node OP1.

Since the thirteenth transistor T13 is turned on and both the first transistor T1 and the fourth transistor T4 are turned off, the voltage of the second output control node OP2 is only affected by the second capacitor C2. From the buffer stage S3 to the stabilization stage S4, the second clock signal has a voltage jump from the high level to the low level. Since the thirteenth transistor T13 is turned on, a voltage at a second terminal of the second capacitor C2 also has a voltage jump from the high level to the low level. Under a coupling effect of the second capacitor C2, a voltage at a first terminal (i.e., the second output control node OP2) of the second capacitor C2 has a voltage jump so that the voltage of the second output control node OP2 drops even lower. Under control of the voltage of the second output control node OP2, the thirteenth transistor T13 is fully turned on so that the second clock signal with the low level may be transmitted to the second terminal of the second capacitor C2 without threshold loss via the thirteenth transistor T13. At this time, the tenth transistor T10 may be better turned on, so that the second voltage signal may be output to the output terminal OUT without threshold loss.

Thereafter, the voltage of the first node N1 is maintained at the low level until arrival of the high level of the next input signal, so the eighth transistor T8 is always in a tuned-on state, thereby maintaining the high level of the first output control node OP1 and the ninth transistor T9 is kept tuned off. In addition, under control of the second clock signal, the voltage of the second output control node OP2 is periodically pulled down, thereby ensuring that the output terminal outputs the low-level second voltage signal, and the whole circuit continuously maintains the output state of the stable stage S4, and subsequent stages will not be described again.

The shift register unit of this embodiment includes thirteen transistors and three capacitors, which may output a level opposite to the opening level of the transistors, and may achieve signal output without threshold loss, thereby improving a display quality of a display substrate.

Figure 4:
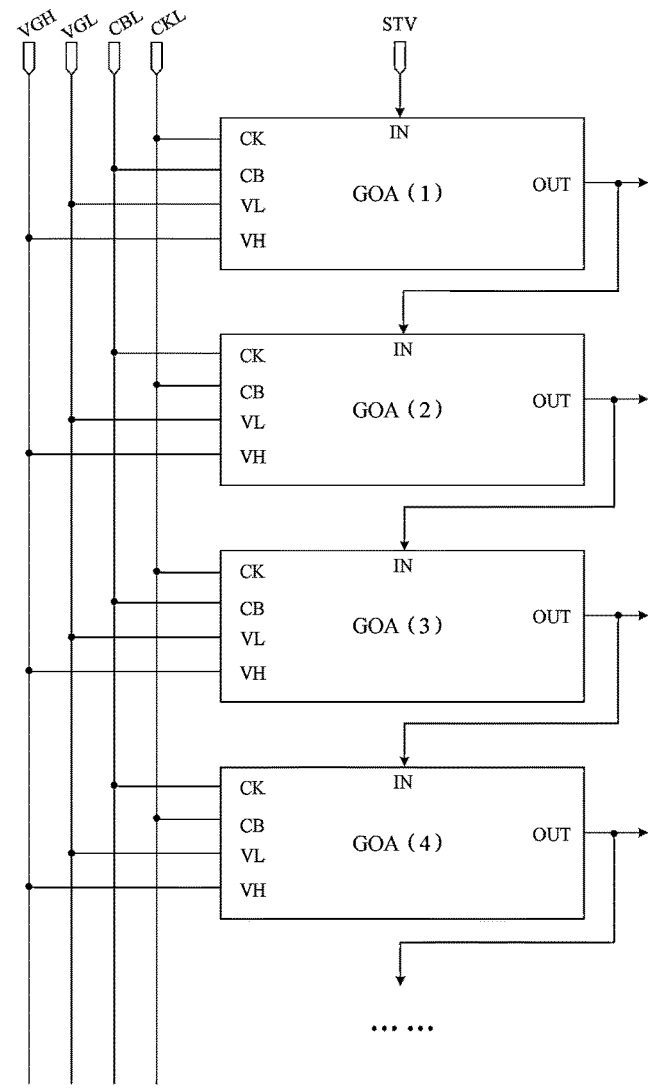
FIG. 4 is a schematic diagram of a gate drive circuit according to at least one embodiment of the present disclosure.

FIG. 4 is a schematic diagram of a gate drive circuit according to at least one embodiment of the present disclosure. In some exemplary implementation, as shown in FIG. 4, the gate drive circuit includes a plurality of cascaded shift register units. Among them, an output terminal of an i-th-stage shift register unit is electrically connected to an input terminal of an (i+1)-th-stage shift register unit. The output signal of shift register unit of each stage except the shift register unit of the last-stage may be used as an input signal of a shift register unit of the next-stage, wherein i is a positive integer.

In some examples, as shown in FIG. 4, a first clock terminal CK of the (2n−1)-th stage shift register unit GOA (2n−1) is electrically connected to a first clock signal line CKL, and a second clock terminal CB of the (2n−1)-th stage shift register unit GOA (2n−1) is electrically connected to a second clock signal line CBL. A first clock terminal CK of the (2n)th-stage shift register unit GOA (2n) is electrically connected to the second clock signal line CBL, and a second clock terminal CB of the (2n)th-stage shift register unit GOA (2n) is electrically connected to the first clock signal line CKL, wherein n is a positive integer. A first power supply terminal VH of the shift register unit of each stage is electrically connected to a first power supply line VGH, and a second power supply terminal VL of the shift register unit of each stage is electrically connected to the second power supply line VGL. However, this embodiment is not limited thereto.

Figure 5:
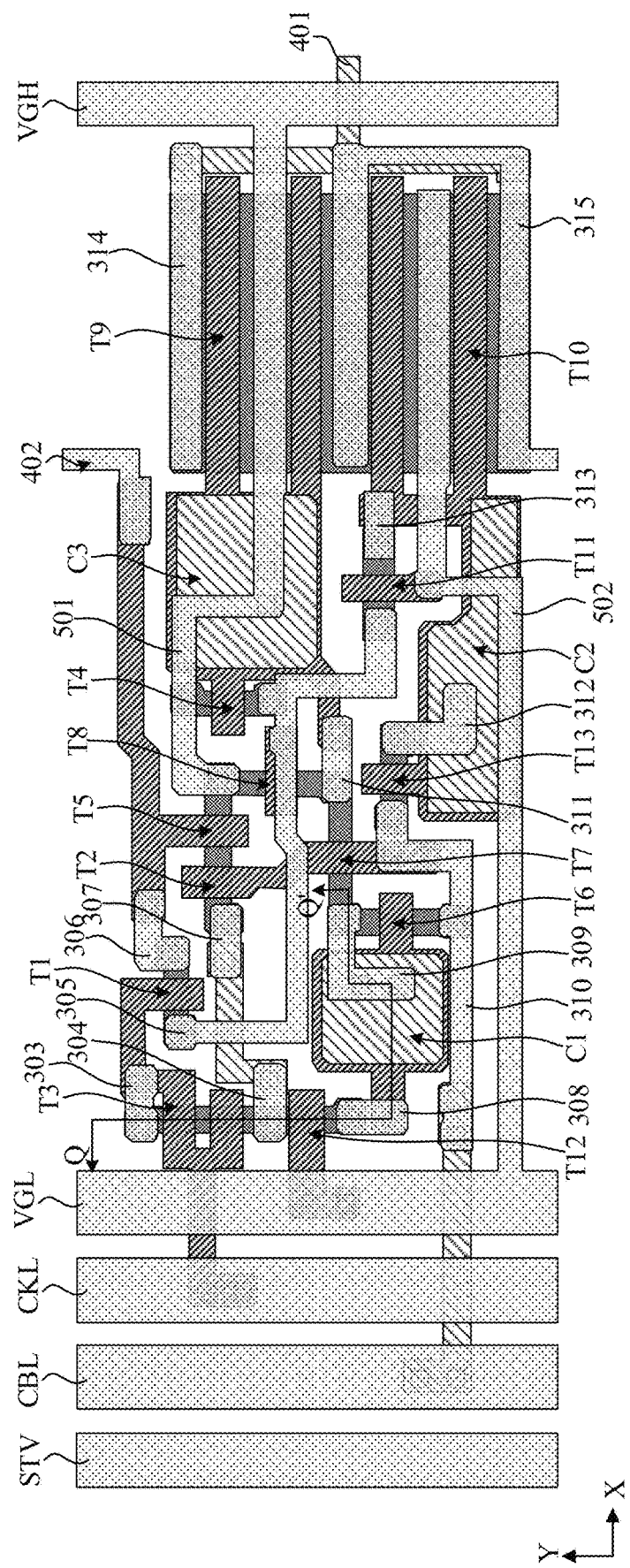
FIG. 5 is a top view of a shift register unit according to at least one embodiment of the present disclosure.
Figure 6:
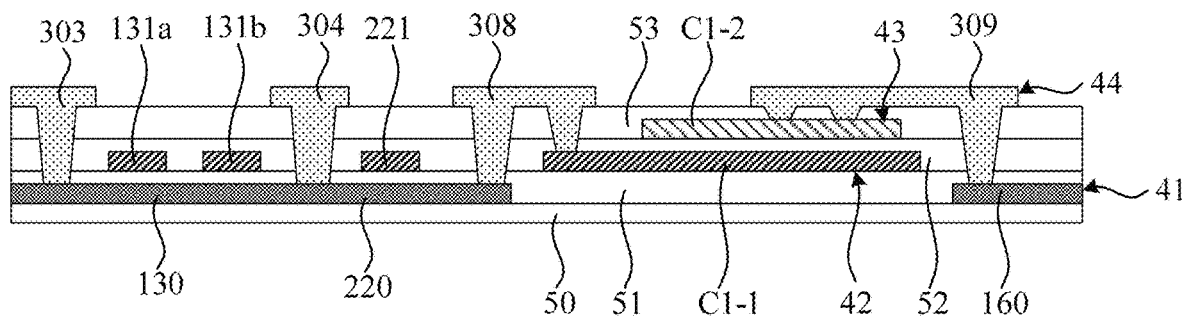
FIG. 6 is a partial cross-sectional schematic view along Q-Q' direction in FIG. 5.

FIG. 5 is a top view of a shift register unit according to at least one embodiment of the present disclosure. FIG. 6 is a partial cross-sectional view along Q-Q' direction in FIG. 5. An equivalent circuit of the shift register unit of this exemplary implementation is shown in FIG. 2. In this exemplary implementation, a case that transistors in the shift register unit are P-type transistors and are also Low Temperature Poly-Silicon thin film transistors is taken as an example for description. However, this embodiment is not limited thereto.

In some exemplary implementations, as shown in FIG. 5, in a plane parallel to the display substrate, a start signal line STV, a second clock signal line CBL, a first clock signal line CKL, a second power supply line VGL, an input control circuit, an output circuit and a first power supply line VGH are arranged sequentially along a first direction X. The start signal line STV, the second clock signal line CBL, the first clock signal line CKL, the second power supply line VGL and the first power supply line VGH all extend along a second direction Y. The first direction X intersects with the second direction Y, for example, the first direction X and the second direction Y are perpendicular to each other. The circuit arrangement of the shift register unit of this exemplary embodiment may save occupied space.

In some exemplary implementations, as shown in FIG. 5, in a plane parallel to the display substrate, the input circuit is located between the second power supply line VGL and a first control sub-circuit of the first control circuit in the first direction X, and is adjacent to a second control sub-circuit in the second direction Y. A second input sub-circuit of the input circuit is located between the second power supply line VGL and a first input sub-circuit in the first direction X. In other words, the second input sub-circuit and the first input sub-circuit are sequentially arranged along a direction away from the second power supply line VGL in the first direction X. The second control circuit is located between the second control sub-circuit of the first control circuit and the output circuit in the first direction X, and is adjacent to the third control sub-circuit of the first control circuit in the second direction Y. In this example, taking the region where the input control circuit is located being a rectangular region as an example, the input circuit and the second control circuit may be located at two ends of a diagonal line of the rectangular region, and the first control circuit is located between the input circuit and the second control circuit. However, this embodiment is not limited thereto.

In some exemplary implementations, as shown in FIG. 5, in a plane parallel to the display substrate, a first transistor T1 of the first output sub-circuit and a third transistor T3 of the second output sub-circuit are adjacent in the first direction X. A second transistor T2 and a fifth transistor T5 of the first control sub-circuit are sequentially arranged along the first direction X. The second transistor T2 is adjacent to the first transistor T1 in the first direction X. A seventh transistor T7 of the second control sub-circuit is adjacent to the second transistor T2 in the second direction Y, a sixth transistor T6 of the second control sub-circuit is adjacent to the first capacitor C1 in the first direction X, a twelfth transistor T12 is adjacent to the first capacitor C1 in the first direction X, and the twelfth transistor T12 is adjacent to the third transistor T3 of the input circuit in the second direction Y. A eighth transistor T8 of the third control sub-circuit is adjacent to the fifth transistor T5 and the thirteenth transistor T13 of the second control circuit in the second direction Y, and is adjacent to the seventh transistor T7 and a fourth transistor T4 in the first direction X. The fourth transistor T4 and a third capacitor C3 of the third control sub-circuit are adjacent in the first direction X. A second capacitor C2 of the second control circuit is adjacent to the thirteenth transistor T13 in the second direction Y, and is also adjacent to an eleventh transistor T11 in the second direction Y. The thirteenth transistor T13 is adjacent to the seventh transistor T7 and the eleventh transistor T11 in the first direction X. The ninth transistor T9 and the tenth transistor T10 of the output circuit are adjacent in the second direction Y. However, this embodiment is not limited thereto.

In some exemplary implementations, as shown in FIG. 5 and FIG. 6, in a direction perpendicular to the display substrate, a non-display area of the display substrate may include a base substrate 50, and a semiconductor layer 41, a first conductive layer 42, a second conductive layer 43 and a third conductive layer 44 arranged on the base substrate 50 sequentially. Among them, the first insulation layer 51 is arranged between the semiconductor layer 41 and the first conductive layer 42, the second insulation layer 52 is arranged between the first conductive layer 42 and the second conductive layer 43, and the third insulation layer 53 is arranged between the second conductive layer 43 and the third conductive layer 44. In some examples, the first insulation layer 51 to the third insulation layer 53 may all be inorganic insulation layers. However, this embodiment is not limited thereto.

Figure 7A:
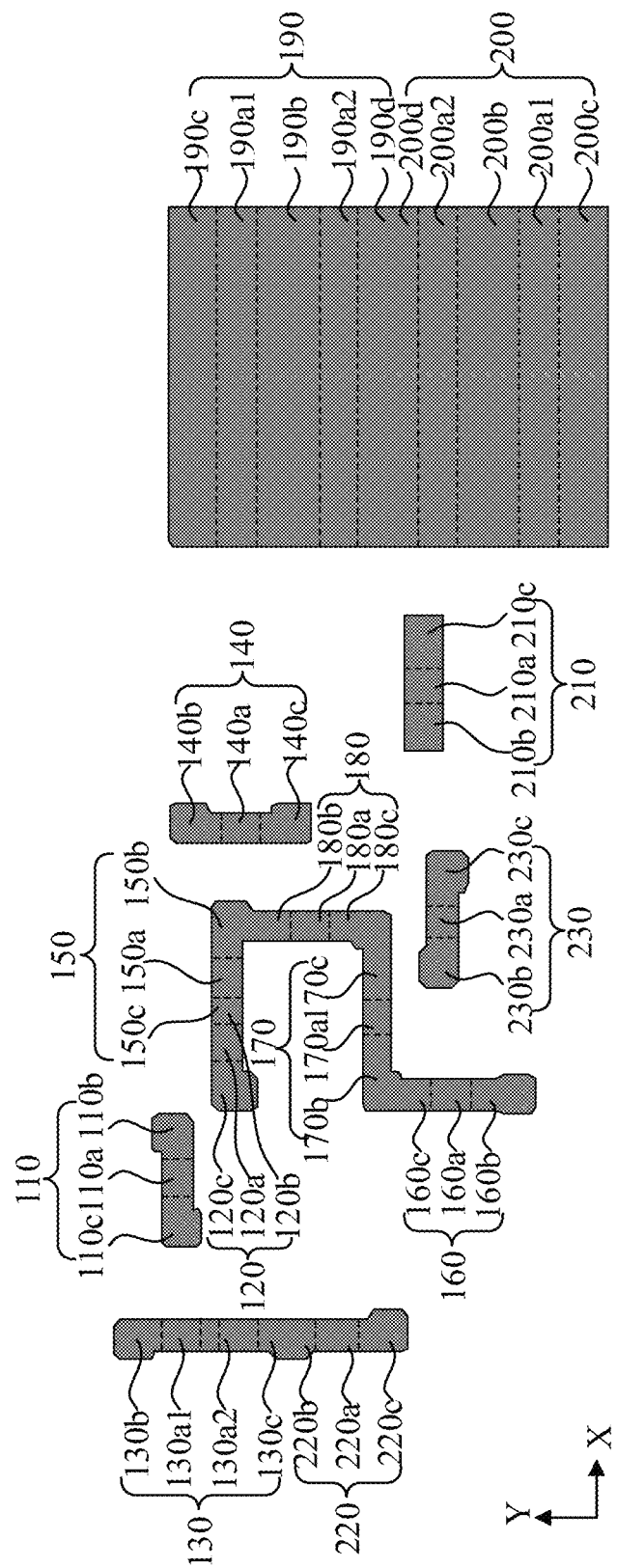
FIG. 7A is a top view of a shift register unit after a semiconductor layer is formed according to at least one embodiment of the present disclosure.

FIG. 7A is a top view of a shift register unit after a semiconductor layer is formed according to at least one embodiment of the present disclosure. As shown in FIG. 5 to FIG. 7A, the semiconductor layer 41 of the non-display area at least includes active layers of a plurality of transistors of the shift register unit. For example, the semiconductor layer 41 at least includes an active layer 110 of the first transistor T1, an active layer 120 of the second transistor T2, an active layer 130 of the third transistor T3, an active layer 140 of the fourth transistor T4, an active layer 150 of the fifth transistor T5, an active layer 160 of the sixth transistor T6, an active layer 170 of the seventh transistor T7, an active layer 180 of the eighth transistor T8, an active layer 190 of the ninth transistor T9, an active layer 200 of the tenth transistor T10, an active layer 210 of the eleventh transistor T11, an active layer 220 of the twelfths transistor T12, and an active layer 230 of the thirteenth transistor T13.

In some exemplary implementations, a material of the semiconductor layer may include, for example, polysilicon. The active layer may include at least one channel region and a plurality of doped regions. The channel region may not be doped with an impurity, and has characteristics of a semiconductor. The plurality of doped regions may be on two sides of the channel region and be doped with impurities, and thus have conductivity. The impurities may be changed according to a type of transistors. In some examples, a doped region of the active layer may be interpreted as a source or a drain of a transistor. In addition, portions of the active layers between the transistors may be interpreted as wirings doped with impurities, and may be used for electrically connecting the transistors.

In some exemplary implementations, as shown in FIG. 7A, the active layer 110 of the first transistor T1, the active layer 120 of the second transistor T2, the active layer 150 of the fifth transistor T5, the active layer 170 of the seventh transistor T7, the active layer 210 of the eleventh transistor T11, and the active layer 230 of the thirteenth transistor T13 all extend along the first direction X. The active layer 130 of the third transistor T3, the active layer 140 of the fourth transistor T4, the active layer 160 of the sixth transistor T6, the active layer 180 of the eighth transistor, the active layer 190 of the ninth transistor T9, the active layer 200 of the tenth transistor T10, and the active layer 220 of the twelfth transistor T12 all extend along the second direction Y. However, this embodiment is not limited thereto.

In some exemplary implementations, as shown in FIG. 7A, the active layer 110 of the first transistor T1 may include a channel region 110a, and a first doped region 110b and second doped region 110c located on two sides of the channel region 110*a* along the first direction. For example, a first electrode of the first transistor T1 may correspond to the first doped region 110*b*, and a second electrode of the first transistor T1 may correspond to the second doped region 110*c*.

As shown in FIG. 7A, the active layer 120 of the second transistor T2 may include a channel region 120*a*, and a first doped region 120*b* and a second doped region 120*c* located on two sides of the channel region 120*a* along the first direction X. For example, a first electrode of the second transistor T2 may correspond to the first doped region 120*b*, and a second electrode of the second transistor T2 may correspond to the second doped region 120*c*. The active layer 150 of the fifth transistor T5 may include a channel region 150*a*, and a first doped region 150*b* and a second doped region 150*c* located on two sides of the channel region 150*a* along the first direction X. For example, a first electrode of the fifth transistor T5 may correspond to the first doped region 150*b*, and a second electrode of the fifth transistor T5 may correspond to the second doped region 150*c*. The active layer 160 of the sixth transistor T6 may include a channel region 160*a*, and a first doped region 160*b* and a second doped region 160*c* located on two sides of the channel region 160*a* along the second direction Y. For example, a first electrode of the sixth transistor T6 may correspond to the first doped region 160*b*, and a second electrode of the sixth transistor T6 may correspond to the second doped region 160*c*. The active layer 170 of the seventh transistor T7 may include a channel region 170*a*, and a first doped region 170*b* and a second doped region 170*c* located on two sides of the channel region 170*a* along the first direction X. For example, a first electrode of the seventh transistor T7 may correspond to the first doped region 170*b*, and a second electrode of the seventh transistor T7 may correspond to the second doped region 170*c*. The active layer 180 of the eighth transistor T8 may include a channel region 180*a*, and a first doped region 180*b* and a second doped region 180*c* located on two sides of the channel region 180*a* along the second direction Y. For example, a first electrode of the eighth transistor T8 may correspond to the first doped region 180*b*, and a second electrode of the eighth transistor T8 may correspond to the second doped region 180*c*.

In this example, the first doped region 120*b* of the active layer 120 of the second transistor T2 is connected to the second doped region 150*c* of the active layer 150 of the fifth transistor T5, the first doped region 150*b* of the active layer 150 of the fifth transistor T5 is connected to the first doped region 180*b* of the active layer 180 of the eighth transistor T8, the second doped region 180*c* of the active layer 180 of the eighth transistor T8 is connected to the second doped region 170*c* of the active layer 170 of the seventh transistor T7, and the first doped region 170*b* of the active layer 170 of the seventh transistor T7 is connected to the second doped region 160*c* of the active layer 160 of the sixth transistor T6. In this example, the active layer 120 of the second transistor T2, the active layer 150 of the fifth transistor T5, the active layer of the eighth transistor T8, and the active layer 170 of the seventh transistor T7 may be of an integral structure which is, for example, U-shaped, which has an opening facing the second power supply line VGL. The active layer 160 of the sixth transistor T6 and the active layer 170 of the seventh transistor T7 may be of an integral structure which is, for example, L-shaped.

As shown in FIG. 7A, the active layer 130 of the third transistor T3 may include channel regions 130*a*1 and 130*a*2, and a first doped region 130*b* and a second doped region 130*c* located on two sides of the channel regions 130*a* and 130*b* along the second direction Y. For example, a first electrode of the third transistor T3 may correspond to the first doped region 130*b*, and a second electrode of the third transistor T3 may correspond to the second doped region 130*c*. The active layer 220 of the twelfth transistor T12 may include a channel region 220*a*, and a first doped region 220*b* and a second doped region 220*c* located on two sides of the channel region 220*a* along the second direction Y. For example, a first electrode of the twelfth transistor T12 may correspond to the first doped region 220*b*, and a second electrode of the twelfth transistor T12 may correspond to the second doped region 220*c*. In this example, the active layer 130 of the third transistor T3 and the active layer 220 of the twelfth transistor T12 may be of an integral structure.

As shown in FIG. 7A, the active layer 140 of the fourth transistor T4 may include a channel region 140*a*, and a first doped region 140*b* and a second doped region 140*c* located on two sides of the channel region 140*a* along the second direction Y. For example, a first electrode of the fourth transistor T4 may correspond to the first doped region 140*b*, and a second electrode of the fourth transistor T4 may correspond to the second doped region 140*c*.

As shown in FIG. 7A, the active layer 190 of the ninth transistor T9 may include channel regions 190*a*1 and 190*a*2, a first doped region 190*b* and a second doped region 190*c* located on two sides of the channel region 190*a*l along the second direction Y, and a third doped region 190*d* located on a side of the channel region 190*a*2 away from the first doped region 190*b* in the second direction Y. The active layer 200 of the tenth transistor T10 may include channel regions 200*a*l and 200*a*2, a first doped region 200*b* and a second doped region 200*c* located on two sides of the channel region 200*a*l along the second direction Y, and a third doped region 200*d* located on a side of the channel region 200*a*2 away from the second doped region 200*b* in the second direction Y. In this example, the active layer 190 of the tenth transistor T9 and the active layer 200 of the eleventh transistor T10 may be of an integral structure which is, for example, of a shape of a rectangle.

As shown in FIG. 7A, the active layer 210 of the eleventh transistor T11 may include a channel region 210*a*, a first doped region 210*b* and a second doped region 210*c* located on two sides of the channel region 210*a* along the first direction X. For example, a first electrode of the eleventh transistor T11 may correspond to the first doped region 210*b*, and a second electrode of the eleventh transistor T11 may correspond to the second doped region 210*c*.

As shown in FIG. 7A, the active layer 230 of the thirteenth transistor T13 may include a channel region 230*a*, and a first doped region 230*b* and a second doped region 230*c* located on two sides of the channel region 230*a* along the first direction X. For example, a first electrode of the thirteenth transistor T13 may correspond to the first doped region 230*b*, and a second electrode of the thirteenth transistor T13 may correspond to the second doped region 230*c*.

Figure 7B:
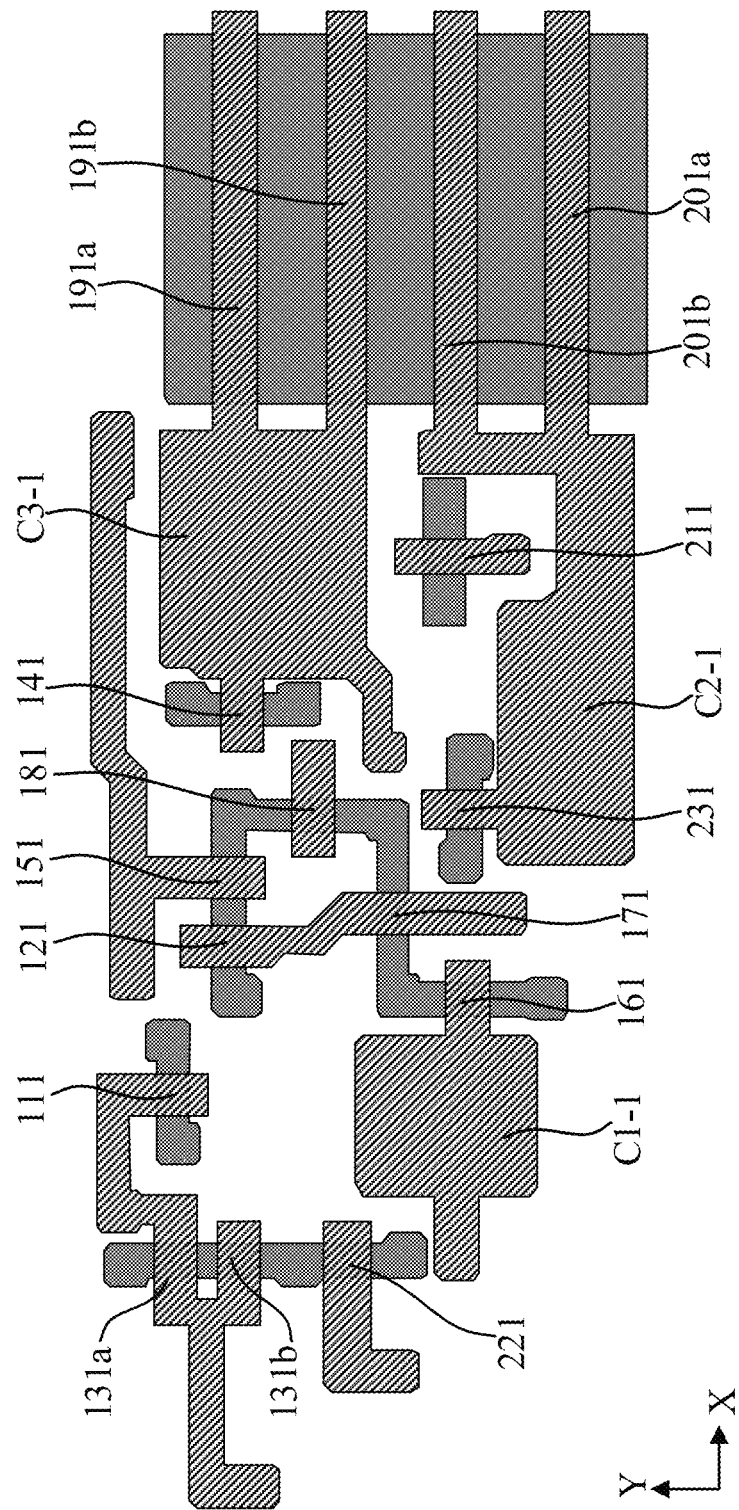
FIG. 7B is a top view of a shift register unit after a first conductive layer is formed according to at least one embodiment of the present disclosure.

FIG. 7B is a top view of a shift register unit after a first conductive layer is formed according to at least one embodiment of the present disclosure. As shown in FIG. 5 to FIG. 7B, the first conductive layer 42 of the non-display area at least includes control electrodes of a plurality of transistors of the shift register unit and first plates of a plurality of capacitors. For example, the first conductive layer 42 at least includes a control electrode 111 of the first transistor T1, a control electrode 121 of the second transistor T2, control electrodes 131*a* and 131*b* of the third transistor T3, a control electrode 141 of the fourth transistor T4, a control electrode 151 of the fifth transistor T5, a control electrode 161 of the sixth transistor T6, a control electrode 171 of the seventh transistor T7, a control electrode 181 of the eighth transistor T8, control electrodes 191a and 191b of the ninth transistor T9, control electrodes 201a and 201b of the tenth transistor T10, a control electrode 211 of the eleventh transistor T11, a control electrode 221 of the twelfth transistor T12, a control electrode 231 of the thirteenth transistor T13, a first plate C1-1 of the first capacitor C1, a first plate C2-1 of the second capacitor C2, and a first plate C3-1 of the third capacitor C3.

In some exemplary implementations, as shown in FIG. 7B, the control electrode 111 of the first transistor T1, and the control electrodes 131a and 131b of the third transistor T3 may be of an integral structure. The control electrode 121 of the second transistor T2 and the control electrode 171 of the seventh transistor T7 may be of an integral structure. The control electrode 141 of the fourth control transistor T4, the control electrodes 191a and 191b of the ninth transistor T9, and the first plate C3-1 of the third capacitor C3 may be of an integral structure. The control electrode 161 of the sixth transistor T6 and the first plate C1-1 of the first capacitor C1 may be of an integral structure. The control electrodes 201a and 201b of the tenth transistor T10 and the first plate C2-1 of the second capacitor C2 may be of an integral structure. However, this embodiment is not limited thereto.

In this exemplary implementation, the third transistor T3, the ninth transistor T9 and the tenth transistor T10 may be double-gate transistors to prevent and reduce the occurrence of a leakage current. However, this embodiment is not limited thereto.

Figure 7C:
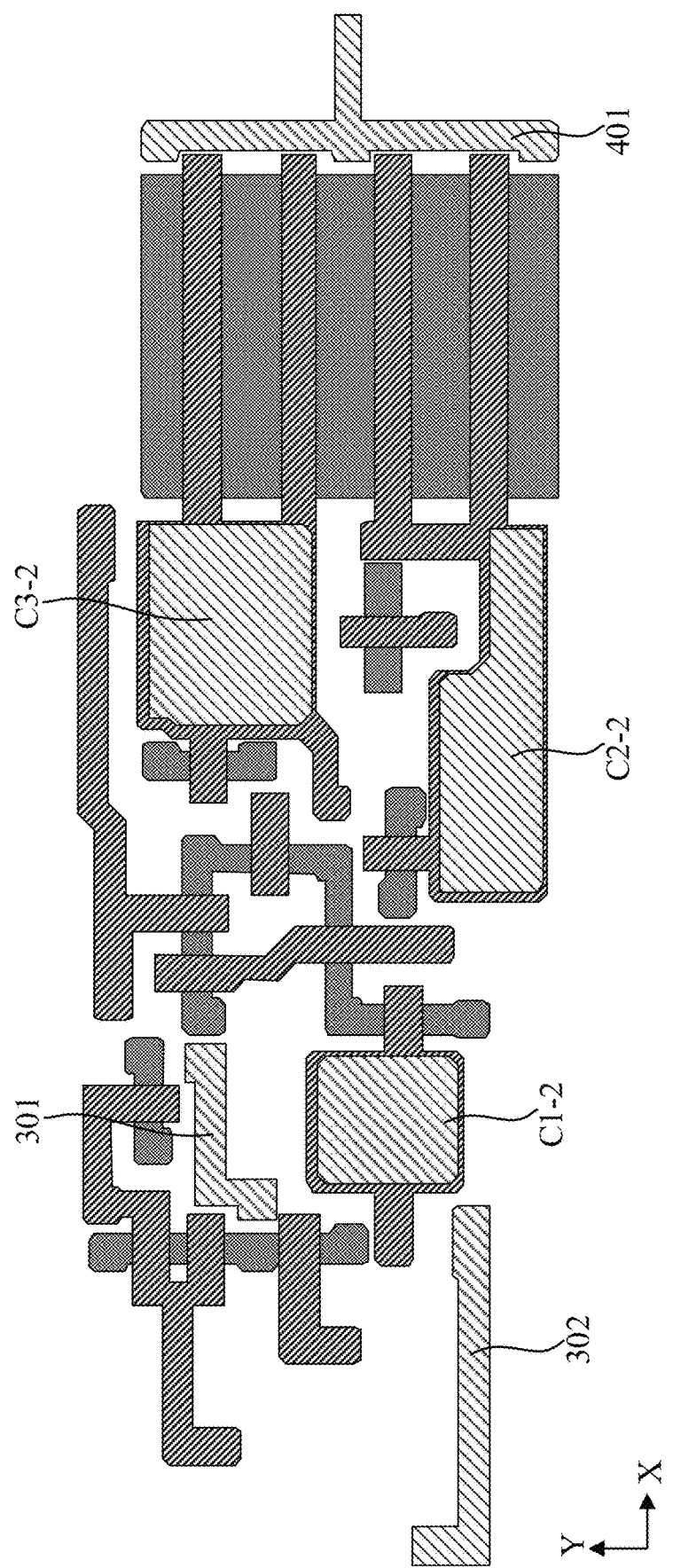
FIG. 7C is a top view of a shift register unit after a second conductive layer is formed according to at least one embodiment of the present disclosure.

FIG. 7C is a top view of a shift register unit after a second conductive layer is formed according to at least one embodiment of the present disclosure. As shown in FIG. 5 to FIG. 7C, the second conductive layer 43 of the non-display area at least includes second plates of a plurality of capacitors of the shift register unit. For example, the second conductive layer 43 may include a second plate C1-2 of a first capacitor C1, a second plate C2-2 of a second capacitor C2, a second plate C3-2 of the third capacitor C3, a first connection electrode 301, a second connection electrode 302, and an output terminal 401.

In some exemplary implementations, as shown in FIG. 7C, an orthographic projection of the first plate C1-1 of the first capacitor C1 on the base substrate may contain an orthographic projection of the second plate C1-2 of the first capacitor C1 on the base substrate. An orthographic projection of the first plate C2-1 of the second capacitor C2 on the base substrate may contain an orthographic projection of the second plate C2-2 of the second capacitor C2 on the base substrate. An orthographic projection of the first plate C3-1 of the third capacitor C3 on the base substrate may contain an orthographic projection of the second plate C3-2 of the third capacitor C3 on the base substrate. The output terminal 401 is located on a side of the output circuit close to the first power supply line VGH in the first direction X. The first connection electrode 301 is configured to achieve an electrical connection between the second transistor T2 and the third transistor T3. The second connection electrode 302 extends along the first direction X and is electrically connected to the second clock signal line CBL, and is configured to transmit the second clock signal.

Figure 7D:
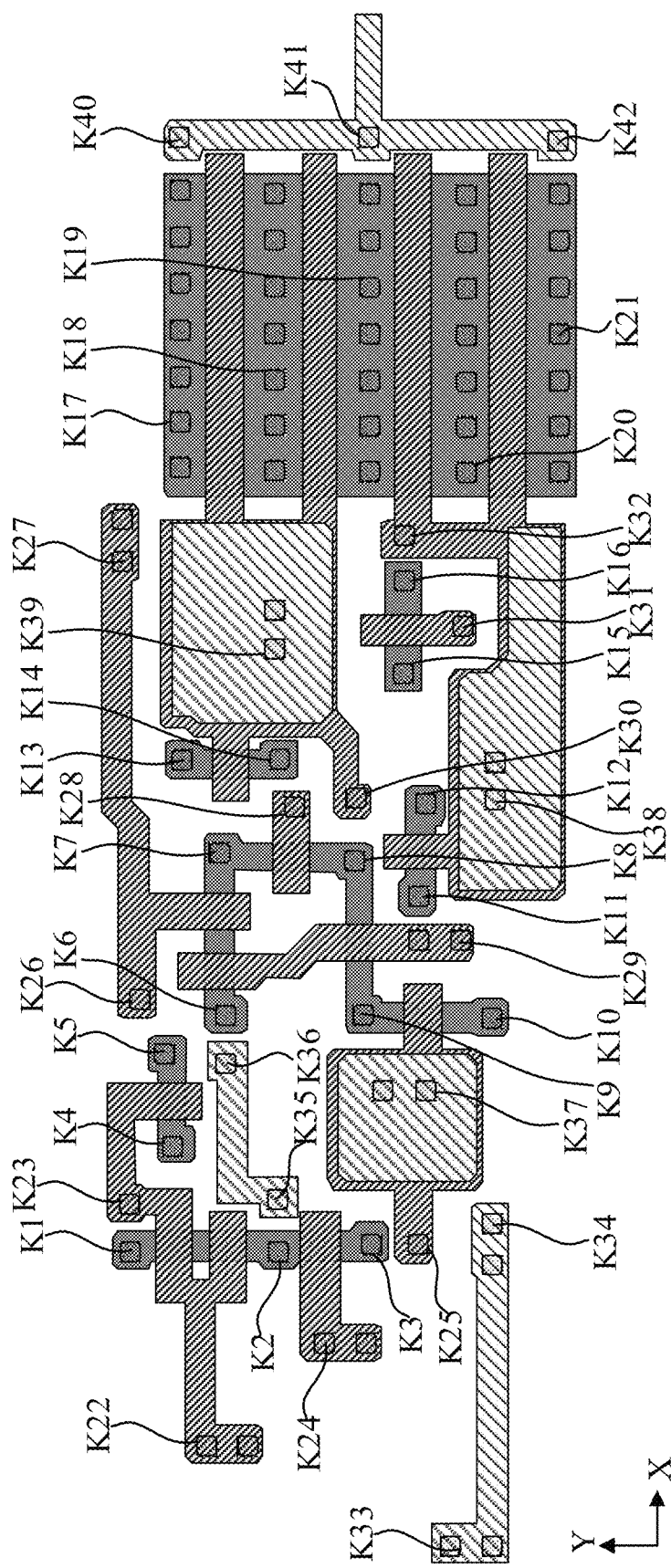
FIG. 7D is a top view of a shift register unit after a third insulation layer is formed according to at least one embodiment of the present disclosure.

FIG. 7D is a top view of a shift register unit after a third insulation layer is formed according to at least one embodiment of the present disclosure. As shown in FIG. 7D, a plurality of vias are formed on the third insulation layer 53 of the non-display area. For example, the plurality of vias may include a first via K1 to a forty-second via K42. Among them, the third insulation layer 53, the second insulation layer 52, and the first insulation layer 51 in the first via K1 to the twenty-first via K21 are removed to expose a surface of the semiconductor layer 41. The third insulation layer 53 and the second insulation layer 52 in the twenty-second via K22 and the thirty-second via K32 are removed to expose a surface of the first conductive layer 42. The third insulation layer 53 in the thirty-third via K33 to the forty-second via K42 is removed to expose a surface of the second transparent conductive layer 43.

In some exemplary implementations, as shown in FIG. 5, the third conductive layer 44 of the non-display area at least includes a plurality of connection electrodes (e.g., a third connection electrode 303 to a fifteenth connection electrode 315, a first power supply connection electrode 501, a second power supply connection electrode 502), an input terminal 402, a start signal line STV, a first clock signal line CKL, a second clock signal line CBL, a first power supply line VGH, and a second power supply line VGL. In some examples, the start signal line STV, the first clock signal line CKL, the second clock signal line CBL, the first power supply line VGH, and the second power supply line VGL all extend along the second direction Y, and the second power supply line VGL, the first clock signal line CKL, the second clock signal line CBL, and the start signal line STV are sequentially arranged along a direction away from the third transistor T3 in the first direction X. The first power supply line VGH is located on a side of the ninth transistor T9 and the tenth transistor T10 away from the second power supply line VGL.

In some exemplary implementations, as shown in FIG. 5 to FIG. 7D, the second clock signal line CBL is electrically connected to the second connection electrode 302 through two thirty-third vias K33 which are provided vertically. The first clock signal line CKL is electrically connected to the control electrodes 131a and 131b of the third transistor T3 through two twenty-second vias K22 which are provided vertically. The second power supply line VGL is electrically connected to the control electrode 221 of the twelfth transistor T12 through two twenty-fourth vias K24 which are provided vertically.

In some exemplary implementations, as shown in FIG. 5 to FIG. 7D, the second power supply connection electrode 502 is electrically connected to a control electrode 211 of the eleventh transistor T11 through the thirty-first via K31, and is also electrically connected to the first doped region 200b of the active layer 200 of the tenth transistor T10 through a plurality (e.g. seven) twentieth via K20 which are provided side by side. An orthographic projection of the second power supply connection electrode 502 on the base substrate is overlapped with an orthographic projection of the second capacitor C2 on the base substrate. For example, the second power supply line VGL and the second power supply connection electrode 502 may be of an integral structure. However, this embodiment is not limited thereto.

In some exemplary implementations, as shown in FIG. 5-FIG. 7D, the first power supply connection electrode 501 is electrically connected to the first doped region 150b of the active layer 150 of the fifth transistor T5 through the seventh via K7, the first power supply connection electrode is also electrically connected to the first doped region 140b of the active layer 140 of the fourth transistor T4 through the thirteenth via K13, the first power supply connection electrode is also electrically connected to the second plate C3-2 of the third capacitor C3 through two thirty-ninth vias K39 which are provided side by side, and the first power supply connection electrode is also electrically connected to the first doped region 190b of the active layer 190 of the ninth transistor T9 through the plurality (e.g. seven) eighteenth via K18 which are provided side by side. An orthographic projection of the first power supply connection electrode 501 on the base substrate is overlapped with an orthographic projection of the third capacitor C3 on the base substrate. For example, the first power supply line VGH and the first power supply connection electrode 501 may be of an integral structure. However, this embodiment is not limited thereto.

In some exemplary implementations, as shown in FIG. 5 to FIG. 7D, the third connection electrode 303 is electrically connected to the first doped region 130b of the active layer 130 of the third transistor T3 through the first via K1, and is also electrically connected to the control electrode 111 of the first transistor T1 through the twenty-third via K23.

In some exemplary implementations, as shown in FIG. 5 to FIG. 7D, the fourth connection electrode 304 is electrically connected to the second doped region 130c of the active layer 130 of the third transistor T3 through the second via K2, and is also electrically connected to one end of the first connection electrode 301 through the thirty-fifth via K35. The seventh connection electrode 307 is electrically connected to the other end of the first connection electrode 301 through the thirty-sixth via K36, and is also electrically connected to the second doped region 120c of the active layer 120 of the second transistor T2 through the sixth via K6. In this example, electrical connection between the second electrode of the third transistor T3 and the second electrode of the second transistor T2 is achieved by the fourth connection electrode 304, the first connection electrode 301 and the seventh connection electrode 307, that is, the second electrode of the third transistor T3 is electrically connected to the second node N2.

In some exemplary implementations, as shown in FIG. 5-FIG. 7D, the fifth connection electrode 305 is electrically connected to the second doped region 110c of the active layer 110 of the first transistor T1 through the fourth via K4, the fifth connection electrode 305 is also electrically connected to the control electrode 181 of the eighth transistor T8 through the twenty-eighth via K28, the fifth connection electrode 305 is also electrically connected to the second doped region 140c of the active layer 140 of the fourth transistor T4 through the fourteenth via K14, and the fifth connection electrode 305 is also electrically connected to the first doped region 210b of the active layer 210 of the eleventh transistor T11 through the fifteenth via K15. In this example, electrical connection between the second electrode of the first transistor T1, the second electrode of the fourth transistor T4, the control electrode of the eighth transistor T8, and the first electrode of the eleventh transistor T11 is achieved through the fifth connection electrode 305, that is, their electrical connection with the first node N1 is achieved.

In some exemplary implementations, as shown in FIG. 5-FIG. 7D, the sixth connection electrode 306 is electrically connected to the first doped region 110b of the active layer 110 of the first transistor T1 through the fifth via K5, and is also electrically connected to the control electrode 151 of the fifth transistor T5 through the twenty-sixth via K26. The input terminal 402 is electrically connected to the control electrode 151 of the fifth transistor T5 through two twenty-seventh vias K27 which are provided side by side. In this example, the first electrode of the first transistor T1 is electrically connected to the input terminal 402 through the control electrode 151 of the fifth transistor T5.

In some exemplary implementations, as shown in FIG. 5-FIG. 7D, the eighth connection electrode 308 is electrically connected to the second doped region 220c of the active layer 220 of the twelfth transistor T12 through the third via K3, and is also electrically connected to the first plate C1-1 of the first capacitor C1 through the twenty-fifth via K25.

In some exemplary implementations, as shown in FIG. 5-FIG. 7D, the ninth connection electrode 309 is electrically connected to the second plate C1-2 of the first capacitor C1 through two thirty-seventh vias K37 which are provided vertically, and is also electrically connected to the second doped region 160c of the active layer 160 of the sixth transistor T6 through the ninth via K9.

In some exemplary implementations, as shown in FIG. 5-FIG. 7D, the tenth connection electrode 310 is electrically connected to the second connection electrode 302 through two thirty-fourth vias K34 which are provided side by side, the tenth connection electrode 310 is also electrically connected to the first doped region 160b of the active layer 160 of the sixth transistor T6 through the tenth via K10, the tenth connection electrode 310 is also electrically connected to the control electrode 171 of the seventh transistor T7 through two twenty-ninth vias K29 which are provided vertically, and is also electrically connected to the first doped region 230b of the active layer 230 of the thirteenth transistor T13 through the eleventh via K11. In this example, the tenth connection electrode 310 is electrically connected to the second clock signal line CBL through the second connection electrode 302, thereby achieving transmission of the second clock signal.

In some exemplary implementations, as shown in FIG. 5-FIG. 7D, the eleventh connection electrode 311 is electrically connected to the second doped region 170c of the active layer 170 of the seventh transistor T7 through the eighth via K8, and is also electrically connected to the first plate C3-1 of the third capacitor C3 through the thirtieth via K30. In this example, an electrical connection between the seventh transistor T7 and the first output control node is achieved through the eleventh connection electrode 311. The twelfth connection electrode 312 is electrically connected to the second plate C2-2 of the second capacitor C2 through two thirty-eighth vias K38 which are provided side by side, and is also electrically connected to the second doped region 230c of the active layer 230 of the thirteenth transistor T13 through the twelfth via K12. The thirteenth connection electrode 313 is electrically connected to the second doped region 210c of the active layer 210 of the eleventh transistor T11 through the sixteenth via K16, and is also electrically connected to the control electrodes 201a and 201b of the tenth transistor T10 through the thirty-second via K32. The fourteenth connection electrode 314 is electrically connected to the second doped region 190c of the active layer 190 of the ninth transistor T9 through a plurality (e.g. seven) seventeenth vias K17 arranged side by side, and is also electrically connected to the output terminal 401 through the fortieth via K40. The fifteenth connection electrode 315 is electrically connected to the third doped region 190d of the active layer 190 of the ninth transistor T9 through the plurality (e.g. seven) of nineteenth vias K19 which are provided side by side, the fifteenth connection electrode 315 is also electrically connected to the second doped region 200c of the active layer 200 of the tenth transistor T10 through the plurality (e.g. seven) of twenty-first vias K21 arranged side by side, and the fifteenth connection electrode 315 is also electrically connected to the output terminal 401 through the forty-first via K41 and the forty-second via K42.

In some examples, the fifteenth connection electrode 315 and the input terminal of the shift register unit of the next stage may be of an integral structure.

In the embodiments of the present disclosure, "provided side by side" may refer to being provided in sequence along the first direction X, and "provided vertically" may refer to being provided sequentially along the second direction Y.

In this exemplary implementation, the first transistor T1 and the third transistor T3 are placed in close proximity in the first direction X, so that the first clock signal may be conveniently shared. The third transistor T3 and the twelfth transistor T12 are arranged in close proximity along the second direction Y, which may facilitate arrangement of common trace of the second node N2. The second transistor T2 and the fifth transistor T5 are placed side by side along the first direction X, so that the input signal and the second clock signal may be conveniently provided simultaneously from both sides in the second direction Y, thereby reducing the space occupation caused by being placed separately. The first transistor T1 and the fifth transistor T5 are placed in close proximity, so that the input signal may be conveniently shared. The fourth transistor T4 and the eighth transistor T8 are placed in close proximity along the first direction X, which may facilitate arrangement of common trace of the first node N1. Extension directions of the active layers of the sixth transistor T6 and the seventh transistor T7 are substantially perpendicular to each other, so that the second clock signal may be conveniently shared. Since the fourth transistor T4 is adjacent to the third capacitor C3, the first plate C3-1 of the third capacitor C3 may be conveniently shared as the control electrode of the fourth transistor T4. The active layers of the second transistor T2 and the fifth transistor T5 are substantially perpendicular to an extension direction of the active layer of the eighth transistor T8, so that arrangement of common trace of the first power supply signal may be conveniently achieved. An orthographic projection of the second capacitor C2 is overlapped with an orthographic projection of the second power supply connection electrode on the base substrate, which may save space better. The display substrate provided by this embodiment may reduce layout space occupied by the shift register units through optimization of circuit layout, thereby providing convenience for achieving a narrow bezel design.

Exemplary description is made below for a manufacturing process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate using deposition, coating, or other processes. If the "thin film" does not need a patterning process in an entire manufacturing process, the "thin film" may also be called a "layer". If the "thin film" needs a patterning process in the entire manufacturing process, it is called a "thin film" before the patterning process, and called a "layer" after the patterning process. The "layer" after the patterning process includes at least one "pattern".

"A and B are arranged in a same layer" mentioned in the present disclosure refers to that A and B are simultaneously formed by a same patterning process. A "thickness" of a thin film layer is a size of the film layer in a direction perpendicular to the display substrate. In the exemplary embodiment of the present disclosure, "a projection of A includes a projection of B" refers to that a boundary of a projection of B falls within a range of a boundary of a projection of A or the boundary of a projection of A coincides with the boundary of a projection of B.

The manufacturing process of the display substrate according to this exemplary embodiment may include the following steps.

(1) A base substrate is provided.

In some exemplary implementations, a base substrate 50 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber.

(2) A pattern of a semiconductor layer is formed.

In some exemplary implementations, a semiconductor thin film is deposited on a base substrate 50, and the semiconductor thin film is patterned through a patterning process to form a pattern of a semiconductor layer arranged on the base substrate 50, as shown in FIG. 7A. The pattern of the semiconductor layer of a non-display area at least includes active layers of a plurality of transistors (for example, transistors T1 to T13) in a shift register unit. The active layer may include at least one channel region and multiple doped regions. The at least one channel region may not be doped with an impurity, and has characteristics of a semiconductor. The doped regions are doped with an impurity and therefore have conductivity. The impurity may be changed according to a type (e.g., an N type or a P type) of the transistor. In some examples, a material of the semiconductor thin film may be polysilicon.

(3) A pattern of a first conductive layer is formed.

In some exemplary implementations, a first insulation thin film and a first conductive thin film are sequentially deposited on the base substrate 50 where the aforementioned patterns are formed, and the first conductive thin film is patterned through a patterning process to form a first insulation layer 51 covering the pattern of the semiconductor layer and a pattern of a first conductive layer arranged on the first insulation layer 51, as shown in FIG. 7B. In some examples, the pattern of the first conductive layer may include control electrodes of the plurality of transistors (for example, the transistors T1 to T13) of the shift register unit, first plates of a plurality of capacitors (for example, a first capacitor C1 to a third capacitor C3) of the shift register unit.

(4) A pattern of a second conductive layer is formed.

In some exemplary implementations, a second insulation thin film and a second conductive thin film are sequentially deposited on the base substrate 50 where the aforementioned patterns are formed, and the second conductive thin film is patterned by using a patterning process to form a second insulation layer 52 covering the first conductive layer and a pattern of a second conductive layer arranged on the second insulation layer 52, as shown in FIG. 7C. In some examples, the pattern of the second conductive layer may include second plates of the plurality of capacitors (for example, the first capacitor C1 to the third capacitor C3) of the shift register unit, an output terminal and a plurality of connection electrodes (for example, the first connection electrode 301 and the second connection electrode 302).

(5) A pattern of a third insulation layer is formed.

In some exemplary implementations, a third insulation thin film is deposited on the base substrate 50 on which the aforementioned patterns are formed, and the third insulation thin film is patterned by using a patterning process to form a pattern of a third insulation layer 53 covering the second conductive layer, as shown in FIG. 7D. In some examples, a plurality of vias are formed on the third insulation layer 53. For example, the plurality of vias may include a first via K1 to a forty-second via K42. Among them, the third insulation layer 53, the second insulation layer 52, and the first insulation layer 51 in the first via K1 to the twenty-first via K21 are removed to expose a surface of the semiconductor layer 41. The third insulation layer 53 and the second insulation layer 52 in the twenty-second via K22 and the thirty-second via K32 are removed to expose a surface of the first conductive layer 42. The third insulation layer 53 in the thirty-third via K33 to the forty-second via K42 is removed to expose a surface of the second transparent conductive layer 43.

(6) A pattern of a third conductive layer is formed.

In some exemplary implementations, a third conductive thin film is deposited on the base substrate 50 where the aforementioned patterns are formed, and the third conductive thin film is patterned through a patterning process to form the pattern of the third conductive layer on the third insulation layer 53, as shown in FIG. 5. In some examples, the pattern of the third conductive layer may include a plurality of connection electrodes (e.g., the third connection electrode 303 to the fifteenth connection electrode 315, the first power supply connection electrode 501, the second power supply connection electrode 502), an input terminal 402, a start signal line STV, a first clock signal line CKL, a second clock signal line CBL, a first power supply line VGH, and a second power supply line VGL.

Subsequently, a fourth insulation layer and a fifth insulation layer may be sequentially formed on a side of the third conductive layer 44 away from the base substrate 50. While a shift register unit is formed in the non-display area, a pixel drive circuit may be formed in a display area. For example, the semiconductor layer of the display area may include an active layer of the transistor of a pixel drive circuit, the first conductive layer of the display area may include a control electrode of a transistor of the pixel drive circuit and a first electrode of a storage capacitor, the second conductive layer of the display area may at least include a second electrode of a storage capacitor of the pixel drive circuit, and the third conductive layer of the display area may at least include a first electrode and a second electrode of the transistor of the pixel drive circuit.

In some exemplary implementations, after the fifth insulation layer is formed, patterns of an anode layer, a pixel definition layer, an organic light emitting layer, a cathode layer, and an encapsulation layer may be sequentially formed in the display area. In some examples, an anode thin film is deposited on the base substrate where the display area of the aforementioned patterns is formed, and the anode thin film is patterned through a patterning process to form a pattern of an anode on the fifth insulation layer. Subsequently, on the base substrate where the aforementioned patterns are formed, a pixel definition thin film is coated, and a pattern of a Pixel Definition layer (PDL) is formed through masking, exposure, and development processes. The pixel definition layer is formed in each sub-pixel in the display area. A pixel opening exposing the anode is formed in the pixel definition layer in each sub-pixel. Subsequently, an organic emitting layer is formed in the pixel openings formed above, and the organic emitting layer is connected to an anode. Subsequently, a cathode thin film is deposited and patterned through a patterning process to form a pattern of a cathode. The cathode is connected to the organic light emitting layer and the second power supply line respectively. Then, an encapsulation layer is formed on the cathode. The encapsulation layer may include a stacked structure of an inorganic material/an organic material/an inorganic material. In some possible implementations, the cathode may be connected to the second power supply line in a plurality of manners, such as by laser drilling.

In some exemplary implementations, the first conductive layer 42, the second conductive layer 43, and the third conductive layer 44 may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be in a single-layer structure or a multi-layer composite structure, such as Mo/Cu/Mo. The first insulation layer 51, the second insulation layer 52, the third insulation layer 53, and the fourth insulation layer may be made of any one or more of silicon oxide (SiOx), silicon nitride (SiNx), and silicon oxynitride (SiON), and may be single layer, multi-layer, or composite layers. The fifth insulation layer may be made of an organic material, such as polyimide, acrylic, or polyethylene terephthalate. The first insulation layer 51 and the second insulation layer 52 may be referred to as Gate Insulation (GI) layers, the third insulation layer 53 is referred to as an Interlayer Dielectric (ILD) layer, the fourth insulation layer may be referred to as a passivation (PVX) layer and the fifth insulation layer may be as a planarization layer. The pixel definition layer may be made of an organic material, such as polyimide, acrylic, or polyethylene terephthalate. The anode may be made of a transparent conductive material, e.g., Indium Tin Oxide (ITO) or Indium Zinc Oxide (IZO). The cathode may be made of any one or more of Magnesium (Mg), Argentum (Ag), Aluminum (Al), Copper (Cu), and Lithium (Li), or an alloy made of any one or more of the aforementioned metals. However, this embodiment is not limited thereto. For example, the anode may be made of a reflective material such as a metal, and the cathode may be made of a transparent conductive material.

The structure shown in the exemplary embodiment and the manufacturing process thereof are merely illustrative. In some exemplary implementations, a corresponding structure may be changed and a patterning process may be added or reduced according to actual needs. For example, the fourth conductive layer may be formed on a side of the third conductive layer away from the base substrate, and an anode and a connection electrode of the pixel circuit may be provided on the fourth conductive layer. In some other examples, at least one of the clock signal line, a double-layer trace design (e.g., the double-layer traces are located in the third conductive layer and the fourth conductive layer, respectively) may be used for the first power supply line, and the second power supply line, and the double-layer traces may be electrically connected through a via, thereby reducing the trace load. However, this embodiment is not limited thereto.

The manufacturing process of this exemplary embodiment may be implemented using an existing mature manufacturing equipment, and may be compatible well with an existing manufacturing process, simple in process implementation, easy to implement, high in a production efficiency, low in production cost, and high in yield rate.

The display substrate provided by this exemplary embodiment may save the space occupied by the shift register unit by optimizing the layout of the shift register unit, which is conducive to achieving the display substrate with a narrow bezel.

An embodiment of the present disclosure further provides a method for manufacturing a display substrate, including: providing a base substrate; and forming a gate drive circuit in a non-display area. The gate drive circuit includes a plurality of cascaded shift register units. A shift register unit of the plurality of cascaded shift register units includes an input control circuit and an output circuit. The input control circuit is electrically connected to a clock signal line group, a first power supply line, a second power supply line and the output circuit. The output circuit is electrically connected to the first power supply line and the second power supply line. The input control circuit at least includes an input circuit and a first control circuit. The input circuit is at least electrically connected to the first node and the second node, and the first control circuit is at least electrically connected to the first node, the second node and the first output control node, and is configured to control a voltage of the first output control node under control of the first node and the second node. The output circuit is electrically connected to the first output control node. The clock signal line group, the second power supply line, the input control circuit, the output circuit and the first power supply line are sequentially arranged along a first direction. The input circuit is located between the second power supply line and the first control circuit in the first direction.

For the method for manufacturing the display substrate in this embodiment, reference may be made to descriptions of the aforementioned embodiments, and thus will not be repeated here.

Figure 8:
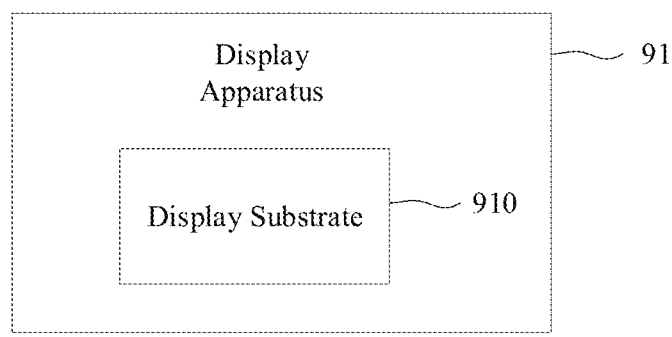
FIG. 8 is a schematic diagram of a display apparatus according to at least one embodiment of the present disclosure.

FIG. 8 is a schematic diagram of a display apparatus according to at least one embodiment of the present disclosure. As shown in FIG. 8, a display apparatus 91 according to this embodiment includes a display substrate 910. The display substrate 910 is the display substrate provided in the above-mentioned embodiments. The display substrate 910 may be an OLED display substrate, a QLED display substrate, a micro-LED display substrate, or a mini-LED display substrate. The display apparatus 91 may be any product or component with a display function, such as an OLED display apparatus, a watch, a mobile phone, a tablet computer, a television, a display, a laptop computer, a digital photo frame, and a navigator. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising a gate drive circuit, and the gate drive circuit comprises a plurality of cascaded shift register units; a shift register unit of the plurality of cascaded shift register units comprises an input control circuit and an output circuit; wherein
   the input control circuit is electrically connected to a clock signal line group, a first power supply line, a second power supply line and the output circuit, and the output circuit is electrically connected to the first power supply line and the second power supply line;
   the input control circuit at least includes an input circuit and a first control circuit, wherein the input circuit is at least electrically connected to a first node and a second node, and the first control circuit is at least electrically connected to the first node, the second node and a first output control node, and is configured to control a voltage of the first output control node under control of the first node and the second node; the output circuit is electrically connected to the first output control node; and
   the clock signal line group, the second power supply line, the input control circuit, the output circuit and the first power supply line are arranged sequentially along a first direction, and the input circuit is located between the second power supply line and the first control circuit in the first direction; wherein
   the input control circuit further comprises a second control circuit; wherein
   the second control circuit is at least electrically connected to the first node and a second output control node, and is configured to control a voltage of the second output control node under control of the first node;
   the output circuit is electrically connected to the second output control node; and
   the second control circuit is located between the first control circuit and the output circuit in the first direction and is adjacent to the first control circuit in a second direction, and the first direction intersects with the second direction; wherein
   the first control circuit at least comprises a first control sub-circuit; wherein
   the first control sub-circuit is electrically connected to an input terminal, a second clock signal line, the second node and the first power supply line, and is configured to transmit a first voltage signal provided by the first power supply line to the second node under control of the input terminal and the second clock signal line; and
   the first control sub-circuit is adjacent to the input circuit in the first direction, and is located on a side of the input circuit away from the second power supply line, and the first control sub-circuit is arranged along the first direction.

2. The display substrate according to claim 1, wherein the input circuit comprises a first input sub-circuit and a second input sub-circuit;
   wherein the first input sub-circuit is electrically connected to an input terminal, a first clock signal line and the first node, and the second input sub-circuit is electrically connected to the first clock signal line and the second node; and
   the second input sub-circuit is located between the second power supply line and the first input sub-circuit in the first direction.

3. The display substrate according to claim 2, wherein the first input sub-circuit comprises a first transistor, and the second input sub-circuit comprises a third transistor; and
   an active layer of the first transistor extends along the first direction, and an active layer of the third transistor extends along the second direction.

4. The display substrate according to claim 1,
wherein the first control sub-circuit comprises a second transistor and a fifth transistor; and
active layers of the second transistor and the fifth transistor both extend along the first direction.

5. The display substrate according to claim 4, wherein the first control circuit further comprises a second control sub-circuit;
the second control circuit is electrically connected to the second clock signal line, the second node and the first output control node, and is configured to control a voltage of the first output control node under control of the second node and the second clock signal line; and
the second control sub-circuit is located between the second power supply line and the second control circuit in the first direction, and is located on a same side of the input circuit and the first control sub-circuit in the second direction.

6. The display substrate according to claim 5, wherein the second control sub-circuit at least comprises a sixth transistor, a seventh transistor, and a first capacitor;
wherein the first capacitor is located on a side of the sixth transistor close to the second power supply line in the first direction, and the seventh transistor is located on a side of the sixth transistor away from the second power supply line in the first direction; and
an active layer of the sixth transistor extends along the second direction, and an active layer of the seventh transistor extends along the first direction.

7. The display substrate according to claim 6, wherein the second control sub-circuit further comprises a twelfth transistor; the twelfth transistor is located on a side of the first capacitor close to the second power supply line in the first direction, and is adjacent to the input circuit in the second direction; and
an active layer of the twelfth transistor extends along the second direction.

8. The display substrate according to claim 5, wherein the first control circuit further comprises a third control sub-circuit;
wherein the third control sub-circuit is electrically connected to the first power supply line, the first node and the first output control node, and is configured to transmit the first voltage signal provided by the first power supply line to the first output control node under control of the first node, or to provide the first voltage signal to the first node under control of the first output control node; and
the third control sub-circuit is located between the first control sub-circuit and the output circuit in the first direction, and is adjacent to the second control circuit in the second direction.

9. The display substrate according to claim 8, wherein the third control sub-circuit comprises a fourth transistor, an eighth transistor, and a third capacitor;
the fourth transistor is located between the eighth transistor and the third capacitor in the first direction, the third capacitor is adjacent to the output circuit in the first direction, and the eighth transistor is adjacent to the first control sub-circuit in the first direction; and
active layers of the fourth transistor and the eighth transistor both extend along the second direction.

10. The display substrate according to claim 9, wherein control electrodes of the fourth transistor and the eighth transistor both extend along the first direction, and the control electrode of the fourth transistor and one of plates of the third capacitor are of an integral structure.

11. The display substrate according to claim 9, wherein the third control sub-circuit and the first control sub-circuit are electrically connected to the first power supply line through a first power supply connection electrode; and
an orthographic projection of the first power supply connection electrode on a base substrate is overlapped with an orthographic projection of the third capacitor on the base substrate.

12. The display substrate according to claim 11, wherein the second power supply line is electrically connected to the output circuit through a second power supply connection electrode, the second power supply connection line extends along the first direction, and an orthographic projection of the second power supply connection line on the base substrate is overlapped with an orthographic projection of the second capacitor on the base substrate.

13. The display substrate according to claim 1, wherein the second control circuit at least comprises a thirteenth transistor and a second capacitor; and the thirteenth transistor and the second capacitor are adjacent in the second direction, and the second capacitor is located on a side of the thirteenth transistor away from the first control circuit.

14. The display substrate according to claim 13, wherein an active layer of the thirteenth transistor extends along the first direction, and a control electrode of the thirteenth transistor and one of plates of the second capacitor are of an integral structure.

15. The display substrate according to claim 13, wherein the second control circuit further comprises an eleventh transistor; the eleventh transistor is located between the thirteenth transistor and the output circuit in the first direction, and is located between the first control circuit and the second capacitor in the second direction, and an active layer of the eleventh transistor extends along the first direction.

16. The display substrate according to claim 1, wherein the first voltage signal output by the first power supply line is greater than a second voltage signal output by the second power supply line.

17. A display apparatus, comprising a display substrate according to claim 1.

18. A method for manufacturing a display substrate, wherein the method comprises:
providing a base substrate;
forming a gate drive circuit; wherein the gate drive circuit comprises a plurality of cascaded shift register units;
a shift register unit of the plurality of cascaded shift register units comprises an input control circuit and an output circuit;
the input control circuit is electrically connected to a clock signal line group, a first power supply line, a second power supply line and the output circuit, and the output circuit is electrically connected to the first power supply line and the second power supply line;
the input control circuit at least comprises an input circuit and a first control circuit, wherein the input circuit is at least electrically connected to a first node and a second node, and the first control circuit is at least electrically connected to the first node, the second node and a first output control node and is configured to control a voltage of the first output control node under control of the first node and the second node;
the output circuit is electrically connected to the first output control node;
the clock signal line group, the second power supply line, the input control circuit, the output circuit and the first power supply line are arranged sequentially along a first direction; and the input circuit is located between the second power supply line and the first control circuit in the first direction; wherein the input control circuit further comprises a second control circuit; wherein the second control circuit is at least electrically connected to the first node and a second output control node, and is configured to control a voltage of the second output control node under control of the first node;

the output circuit is electrically connected to the second output control node; and the second control circuit is located between the first control circuit and the output circuit in the first direction and is adjacent to the first control circuit in a second direction, and the first direction intersects with the second direction;

wherein the first control circuit at least comprises a first control sub-circuit;

wherein the first control sub-circuit is electrically connected to an input terminal, a second clock signal line, the second node and the first power supply line, and is configured to transmit a first voltage signal provided by the first power supply line to the second node under control of the input terminal and the second clock signal line; and the first control sub-circuit is adjacent to the input circuit in the first direction, and is located on a side of the input circuit away from the second power supply line, and the first control sub-circuit is arranged along the first direction.

* * * * *